United States Patent
Chang et al.

(10) Patent No.: US 12,349,423 B2
(45) Date of Patent: Jul. 1, 2025

(54) MEMORY DEVICES AND METHODS OF MANUFACTURING THEREOF

(71) Applicant: Taiwan Semiconductor Manufacturing Company Limited, Hsinchu (TW)

(72) Inventors: Meng-Sheng Chang, Chu-bei (TW); Chia-En Huang, Hsinchu County (TW); Yih Wang, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 270 days.

(21) Appl. No.: 16/881,777

(22) Filed: May 22, 2020

(65) Prior Publication Data
US 2021/0367034 A1 Nov. 25, 2021

(51) Int. Cl.
*H10D 62/10* (2025.01)
*H01L 23/525* (2006.01)
(Continued)

(52) U.S. Cl.
CPC ....... *H10D 62/118* (2025.01); *H01L 23/5252* (2013.01); *H10B 20/25* (2023.02);
(Continued)

(58) Field of Classification Search
CPC ........... H01L 27/11206; H01L 23/5252; H01L 29/0673; H01L 29/42392; H01L 29/66439;
(Continued)

(56) References Cited

U.S. PATENT DOCUMENTS 9,837,414 B1 12/2017 Balakrishnan et al.
10,008,583 B1 * 6/2018 Rodder .............. H10D 30/6757
(Continued)

FOREIGN PATENT DOCUMENTS

CN 108206180 A 6/2018
JP 2020-515083 A 5/2020
(Continued)

OTHER PUBLICATIONS

KR Notice of Allowance of Patent on Korean Patent Appl. Ser. No. 10-2020-0113086 dated Jan. 27, 2022 (6 pages).
(Continued)

*Primary Examiner* — Aaron J Gray
(74) *Attorney, Agent, or Firm* — FOLEY & LARDNER LLP

(57) ABSTRACT

A memory device includes first nanostructures stacked on top of one another; first gate stacks, where two adjacent ones of the first gate stacks wrap around a corresponding first nanostructure; second nanostructures stacked on top of one another; second gate stacks, where two adjacent ones of the second gate stacks wrap around a corresponding second nanostructure; a first drain/source feature electrically coupled to a first end of the first nanostructures; a second drain/source feature electrically coupled to both of a second end of the first nanostructures and a first end of the second nanostructures; and a third drain/source feature electrically coupled to a second end of the second nanostructures. At least one of the plurality of first gate stacks is in direct contact with at least one of the first drain/source feature or the second drain/source feature.

20 Claims, 19 Drawing Sheets

(51) Int. Cl.
*H10B 20/25* (2023.01)
*H10D 30/01* (2025.01)
*H10D 30/43* (2025.01)
*H10D 30/67* (2025.01)

(52) U.S. Cl.
CPC .......... *H10D 30/014* (2025.01); *H10D 30/43* (2025.01); *H10D 30/6735* (2025.01); *H10D 62/116* (2025.01); *H10D 62/121* (2025.01); *H10D 62/115* (2025.01)

(58) Field of Classification Search
CPC ....... H01L 29/775; H01B 20/20; H01B 20/25; H10D 62/118; H10D 30/014; H10D 30/43; H10D 30/6735; H10D 62/121
See application file for complete search history.

(56) References Cited

U.S. PATENT DOCUMENTS

| | | | | |
|---|---|---|---|---|
| 10,141,403 | B1* | 11/2018 | Cheng | H10D 62/121 |
| 10,263,100 | B1 | 4/2019 | Bi et al. | |
| 2017/0154890 | A1* | 6/2017 | Jin | H01L 23/5252 |
| 2017/0222024 | A1* | 8/2017 | Bergendahl | H01L 21/02532 |
| 2018/0082902 | A1 | 3/2018 | Balakrishnan et al. | |
| 2018/0083113 | A1* | 3/2018 | Balakrishnan | H10D 64/01 |
| 2018/0175035 | A1* | 6/2018 | Yang | H10D 84/83 |
| 2019/0326288 | A1* | 10/2019 | Hashemi | H10D 62/116 |
| 2019/0326395 | A1 | 10/2019 | Ando et al. | |
| 2020/0098879 | A1 | 3/2020 | Lee et al. | |
| 2020/0127054 | A1* | 4/2020 | Ando | H10N 70/021 |
| 2020/0161339 | A1* | 5/2020 | Lee | H10D 30/43 |
| 2020/0185539 | A1* | 6/2020 | Lee | H10D 30/014 |
| 2020/0388678 | A1* | 12/2020 | Yang | H10D 62/151 |
| 2021/0028173 | A1 | 1/2021 | Yang et al. | |

FOREIGN PATENT DOCUMENTS

| | | |
|---|---|---|
| KR | 101624409 B1 | 5/2016 |
| KR | 20200026730 A | 3/2020 |
| KR | 20200035896 A | 4/2020 |

OTHER PUBLICATIONS

Office Action issued in connection with Chinese Appl. No. 202110476796.8 dated Apr. 29, 2024.

Office Action issued in German Appl. No. 102020116048.8 dated Apr. 9, 2025.

* cited by examiner

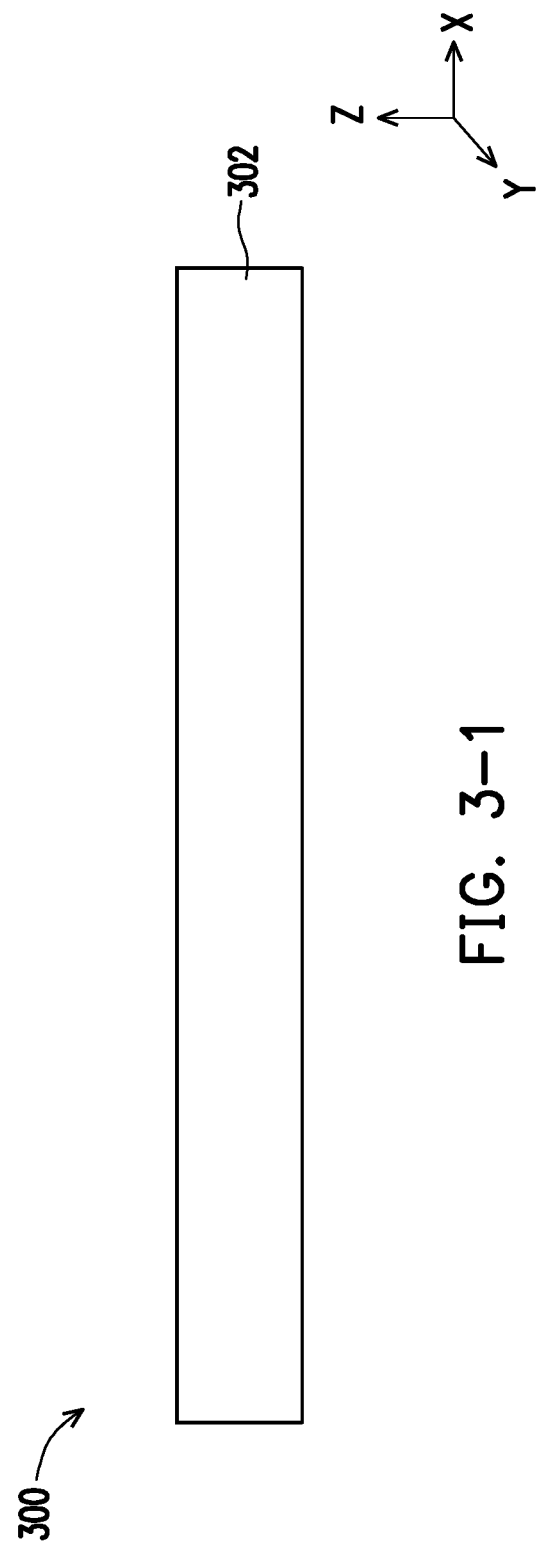

MEMORY DEVICES AND METHODS OF MANUFACTURING THEREOF

BACKGROUND

Integrated circuits (ICs) sometimes include one-time-programmable (OTP) memories to provide non-volatile memory (NVM) in which data are not lost when the IC is powered off. One type of the OTP devices includes anti-fuse memories. The anti-fuse memories include a number of anti-fuse memory cells (or bit cells), whose terminals are disconnected before programming, and are shorted (e.g., connected) after the programming. The anti-fuse memories may be based on metal-oxide-semiconductor (MOS) technology. For example, an anti-fuse memory cell may include a programming MOS transistor (or MOS capacitor) and at least one reading MOS transistor. A gate dielectric of the programming MOS transistor may be broken down to cause the gate and the source or drain region of the programming MOS transistor to be interconnected. Depending on whether the gate dielectric of the programming MOS transistor is broken down, different data bits can be presented by the anti-fuse memory cell through reading a resultant current flowing through the programming MOS transistor and reading MOS transistor. The anti-fuse memories have the advantageous features of reverse-engineering proofing, since the programming states of the anti-fuse cells cannot be determined through reverse engineering.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3-1, 3-2, 3-3, 3-4, 3-5, 3-6, 3-7, 3-8, 3-9, 3-10, 3-11, 3-12, and 3-13 illustrate cross-sectional views of a memory device, made by the method of FIG. 2, at various fabrication stages, in accordance with some embodiments.

FIG. 4 illustrates a cross-sectional view of another example memory device 400, in accordance with some embodiments.

FIGS. 5, 6, and 7 illustrate various example nanostructure transistors including partial inner spacers, in accordance with some embodiments.

DETAILED DESCRIPTION

Figure 1:
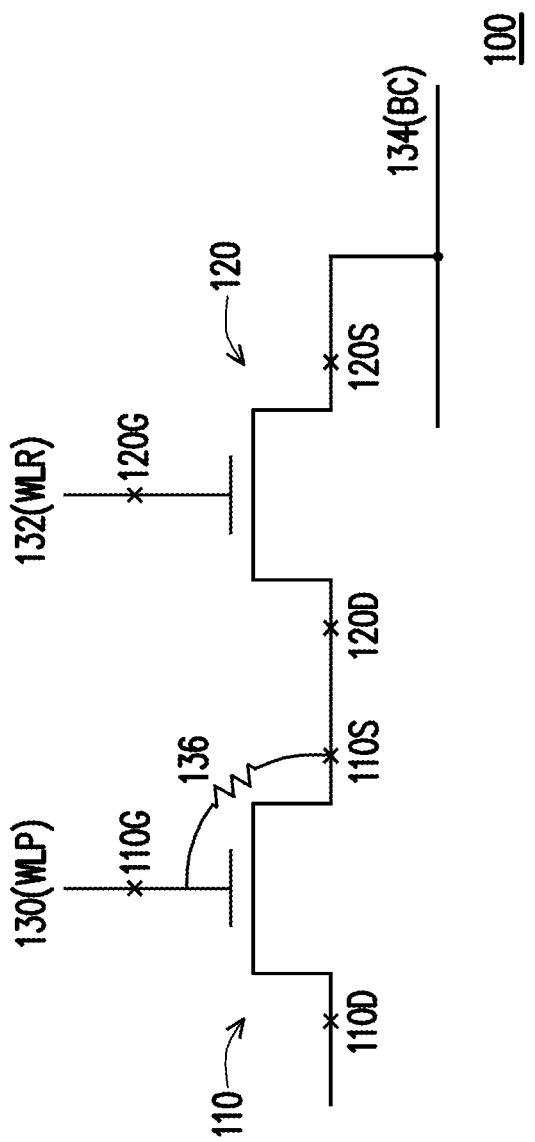
FIG. 1 illustrates an example circuit diagram of a memory cell, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In contemporary semiconductor device fabrication processes, a large number of semiconductor devices, such as silicon channel n-type field effect transistors (nFETs) and silicon germanium channel p-type field effect transistors (pFETs), are fabricated on a single wafer. Non-planar transistor device architectures, such as fin-based transistors, can provide increased device density and increased performance over planar transistors. Some advanced non-planar transistor device architectures, such as nanostructure (e.g., nanosheet, nanowire or multi-bridge-channel) transistors, can further increase the performance over fin-based transistors partially due to the characteristic of its conduction channel wrapped around by the respective gate feature.

Such a nanosheet transistor includes multiple semiconductor sheets. The multiple semiconductor sheets may collectively form a conduction channel for the nanosheet transistor. Each of the semiconductor sheets is separated by a gate stack including a layer of electrically conductive gate and a gate dielectric. The gate stacks wrap around all sides of the semiconductor sheets, thereby forming a gate-all-around (GAA) structure. Epitaxial growths on the ends of the semiconductor nanosheets form source/drain features for the nanosheet transistors. Spacers can be formed between the gate stacks from the source/drain features of the nanosheet transistors. Such spacers are typically referred to as "inner spacers." The inner spacers, formed of dielectric materials, can electrically isolate the gate stacks from the respective source/drain features, which may reduce parasitic capacitances induced therebetween (e.g., $C_{gd}$, $C_{gs}$).

By adopting such a nanosheet transistor configuration to form the reading transistor of a memory cell (e.g., an anti-fuse memory cell), performance (e.g., switching speed) of the reading transistor can be improved. However, the inner spacers, coupled between the gate stacks and source/drain features, may increase a time and voltage (typically referred to as "$T_{BD}$" and "$V_{BD}$," respectively) to break down the gate dielectric. This is partially due to the presence of the inner spacers may decrease the contact area between the gate stacks and nanosheets, which in turn decreases the contact area of each of the gate stacks to the source/drain features. As such, overall performance (e.g., operation speed, programming yield, etc.) of the anti-fuse memory cell may be disadvantageously affected.

The present disclosure provides various embodiments of a memory cell in a nanosheet transistor configuration. In some embodiments, the disclosed memory cell includes an anti-fuse memory cell constituted by a programming transistor and one or more reading transistors. Each of the programming transistor and reading transistor(s) includes a nanosheet transistor. The programming transistor may have less dielectric materials coupled between respective gate stacks and source/drain features, and the reading transistor may have more dielectric materials coupled between respective gate stacks and source/drain features. For example, the programming transistor of the disclosed memory cell can include one or more gate stacks that are in direct contact with at least one of its respective source/drain features, while the reading transistor can includes one or more gate stacks that are electrically isolated from its respective source/drain features by inner spacers.

FIG. 1 illustrates an example circuit diagram of a memory cell 100, in accordance with some embodiments. As shown, the memory cell (or sometimes referred to as a memory bit cell, a memory bit, or a bit) 100 includes a first transistor 110 and a second transistor 120. Each of the first and second transistors, 110 and 120, may include an n-type metal-oxide-semiconductor field-effect-transistor (MOSFET). The transistors 110 and 120 may each include another type of the MOSFET, e.g., a p-type MOSFET. In some other embodiments, at least one of the transistors 110 or 120 may be replaced by another type of electronic devices, e.g., a MOS capacitor, while remaining within the scope of the present disclosure. The first transistor 110 and the second transistor 120 are electrically coupled to each other in series. For example, source of the first transistor, 110S, is connected to drain of the second transistor, 120D.

The memory cell 100 may be configured as a one-time-programmable (OTP) memory cell such as, for example, an anti-fuse cell. It is understood that the memory cell 100 may be configured as any type of the memory cell that includes two transistors electrically coupled to each other in series (e.g., a NOR-type non-volatile memory cell, a dynamic random-access memory (DRAM) cell, a two-transistor static random-access memory (SRMA) cell, etc.).

When the memory cell 100 is configured as an anti-fuse cell, the first transistor 110 can function as a programming transistor and the second transistor 120 can function as a reading transistor. As such, drain of the first transistor 110D is floating (e.g., coupled to nothing), and gate of the first transistor 110G is coupled to a programming word line (WLP) 130; and gate of the second transistor 120G is coupled to a reading word line (WLR) 132, and source of the second transistor 120S is coupled to a bit line (BL) 134.

To program the memory cell 100, the reading transistor 120 is turned on by supplying a high voltage (e.g., a positive voltage corresponding to a logic high state) to the gate 120G via the WLR 132. Prior to, concurrently with or subsequently to the reading transistor 120 being turned on, a sufficiently high voltage (e.g., a breakdown voltage ($V_{BD}$)) is applied to the WLP 130, and a low voltage (e.g., a positive voltage corresponding to a logic low state) is applied to the BL 134. The low voltage (applied on the BL 134) can be passed to the source 110S such that $V_{BD}$ will be created across the source 110S and the gate 110G to cause a breakdown of a portion of a gate dielectric (e.g., the portion between the source 110S and the gate 110G) of the programming transistor 110. After the breakdown of the gate dielectric of the programming transistor 110, a behavior of the portion interconnecting the gate 110G and source 110S is equivalently resistive. For example, such a portion may function as a resistor 136. Before the programming (before the gate dielectric of the programming transistor 110 is broken down), no conduction path exists between the BL 134 and the WLP 130, when the reading transistor 120 is turned on; and after the programming, a conduction path exists between the BL 134 and the WLP 130 (e.g., via the resistor 136), when the reading transistor 120 is turned on.

To read the memory cell 100, similarly to the programming, the reading transistor 120 is turned on and the BL 134 is coupled to a voltage corresponding to the logic low state. In response, a positive voltage is applied to the gate of the programming transistor 110G. As discussed above, if the gate dielectric of the programming transistor 110 is not broken down, no conduction path exists between the BL 134 and the WLP 130. Thus, a relatively low current conducts from the WLP 130, through the transistors 110 and 120, and to the BL 134. If the gate dielectric of the programming transistor 110 is broken down, a conduction path exists between the BL 134 and the WLP 130. Thus, a relatively high current conducts from the WLP 130, through the transistor 110 (now equivalent to the resistor 136) and transistor 120, and to the BL 134. Such a low current and high current may sometimes be referred to as $I_{off}$ and $I_{on}$ of the memory cell 110, respectively. A circuit component (e.g., a sensing amplifier), coupled to the BL 134 can differentiate $I_{off}$ from $I_{on}$ (or vice versa), and thus determine whether the memory cell 100 presents a logic high ("1") or a logic low ("0"). For example, when $I_{on}$ is read, the memory cell 100 may present 1; and when $I_{off}$ is read, the memory cell 100 may present 0.

Figure 2:
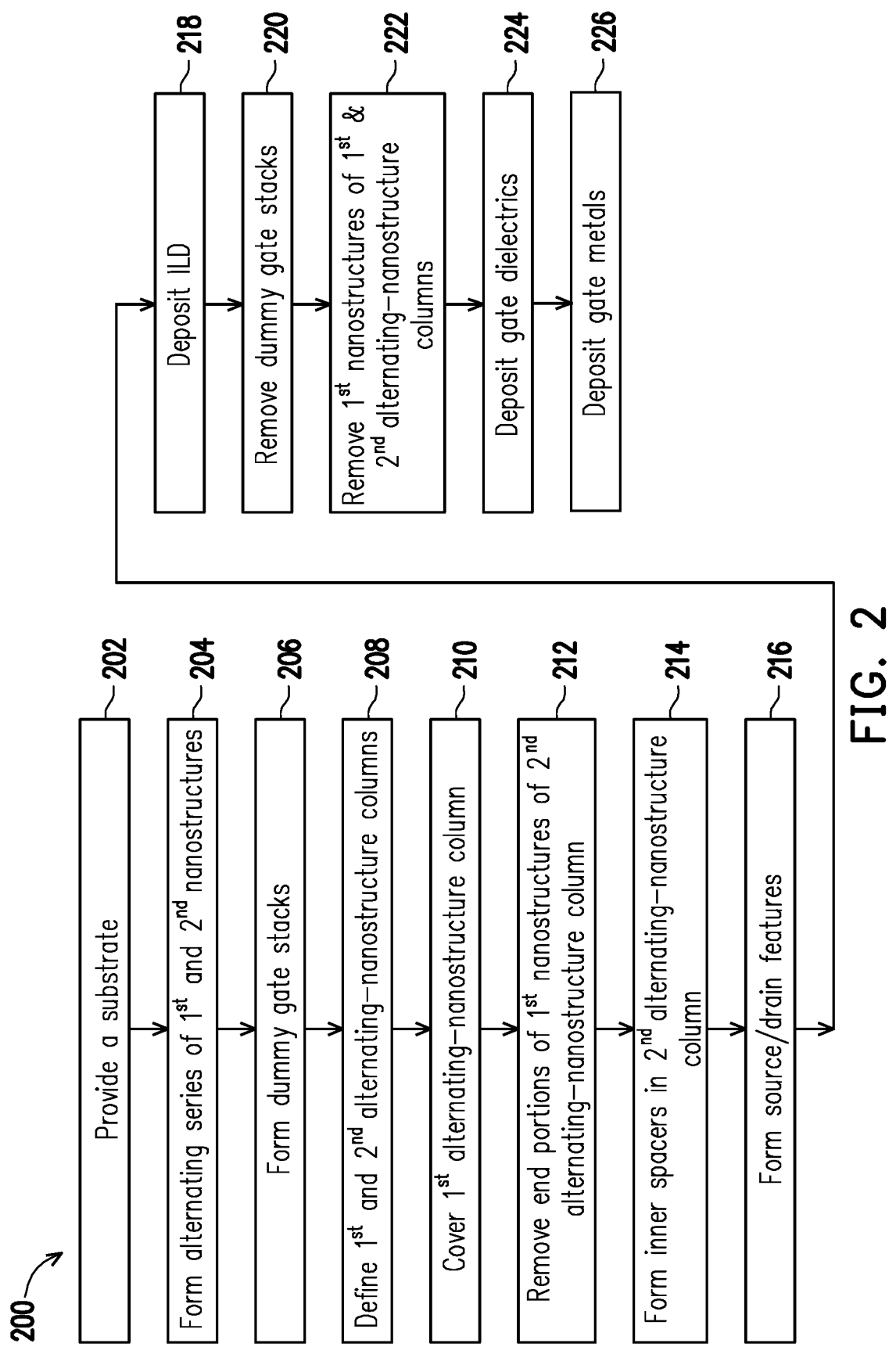
FIG. 2 illustrates a flow chart of an example method to fabricate a memory device, in accordance with some embodiments.

FIG. 2 illustrate a flowchart of a method 200 to form a memory device, according to one or more embodiments of the present disclosure. The method 200 may be used to form an anti-fuse memory cell, including a programming transistor and a reading transistor, coupled in series. It is noted that the method 200 is merely an example and is not intended to limit the present disclosure. Accordingly, it is understood that additional operations may be provided before, during, and after the method 200 of FIG. 2, and that some other operations may only be briefly described herein.

The operations of the method 200 may be associated with cross-sectional views of a memory device at respective fabrication stages as shown in FIGS. 3-1, 3-2, 3-3, 3-4, 3-5, 3-6, 3-7, 3-8, 3-9, 3-10, 3-11, 3-12, and 3-13. In some embodiments, the memory device may be included in or otherwise coupled to a microprocessor, another memory device, and/or other integrated circuit (IC). Also, FIGS. 3-1 to 3-13 are simplified for a better understanding of the concepts of the present disclosure. Although the figures illustrate the memory device, it is understood the IC may include a number of other devices such as inductors, resistor, capacitors, transistors, etc., which are not shown in FIGS. 3-1 to 3-13, for purposes of clarity of illustration.

Referring first to FIG. 2, in brief overview, the method 200 starts with operation 202 in which a substrate is provided. The method 200 proceeds to operation 204 in which an alternating series of first nanostructures and second nanostructures are formed. The method 200 proceeds to operation 206 in which a number of dummy gate stacks are formed. The method 200 proceeds to operation 208 in which a first alternating-nanostructure column and a second alternating-nanostructure column are defined. The method 200 proceeds to operation 210 in which the first alternating-nanostructure column is covered. The method 200 proceeds to operation 212 in which respective end portions of the first nanostructures of the second alternating-nanostructure column are removed. The method 200 proceeds to operation 214 in which inner spacers are formed in the second alternating-nanostructure column. The method 200 proceeds to operation 216 in which source features and drain features are formed. The method 200 proceeds to operation 218 in which an inter-layer dielectric is deposited. The method 200 proceeds to operation 220 in which the dummy gate stacks are removed. The method 200 proceeds to operation 222 in which the first nanostructures of the first and second alternating-nanostructure columns are removed. The method 200 proceeds to operation 224 in which gate dielectrics are deposited. The method 200 proceeds to operation 226 in which gate metal are deposited.

Figures 2, 3:
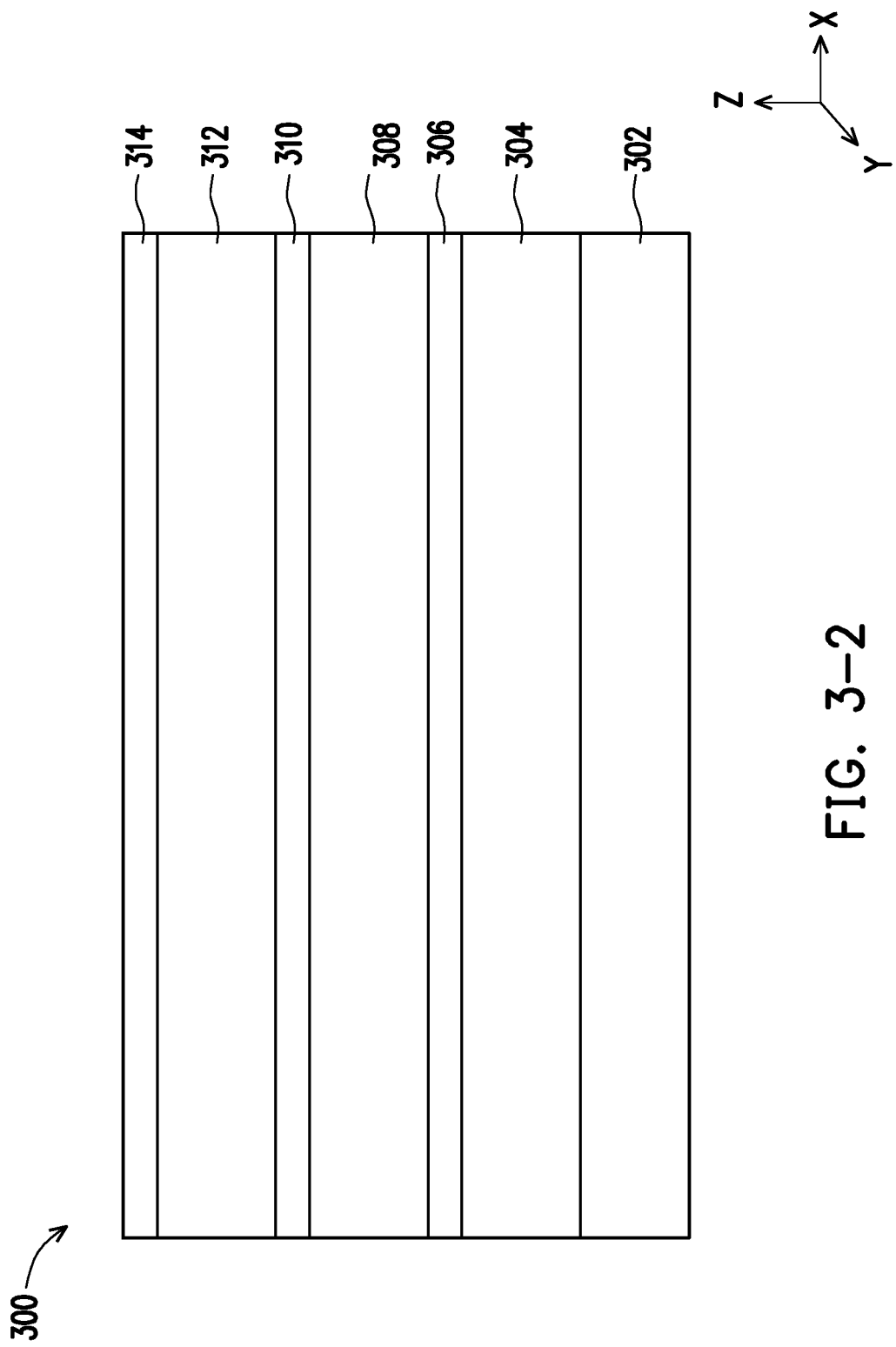
Figure 3:
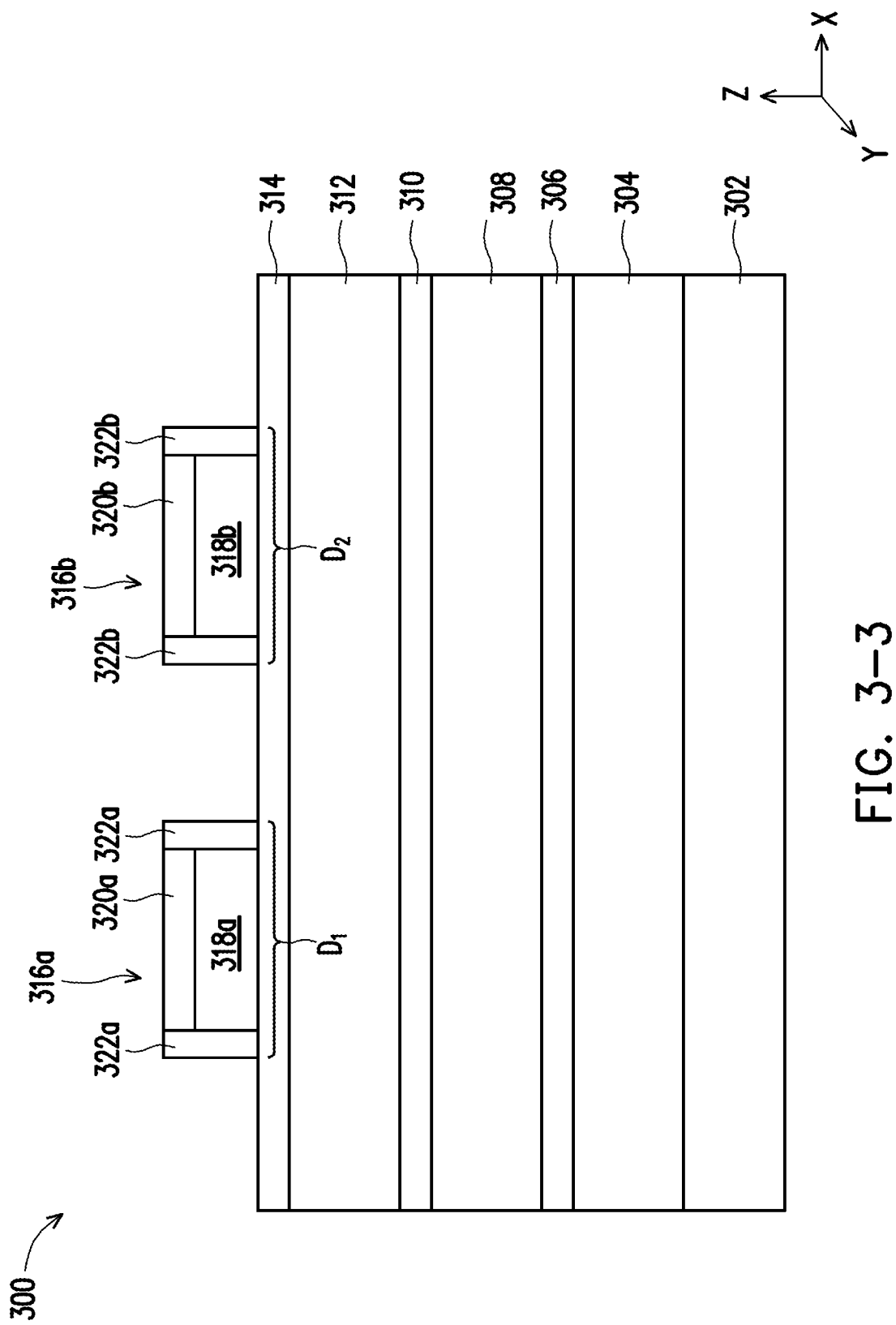

Corresponding to operation 202, FIG. 3-1 is a cross-sectional view of a memory device 300, cut by a plane perpendicular to the Y direction, which includes the substrate 302, at one of the various stages of fabrication. The substrate 302 includes a semiconductor material substrate, for example, silicon. Alternatively, the substrate 302 may include another elementary semiconductor material such as, for example, germanium. The substrate 302 may also include a compound semiconductor such as silicon carbide, gallium arsenic, indium arsenide, and indium phosphide. The substrate 302 may include an alloy semiconductor such as silicon germanium, silicon germanium carbide, gallium arsenic phosphide, and gallium indium phosphide. In one embodiment, the substrate 302 includes an epitaxial layer. For example, the substrate may have an epitaxial layer overlying a bulk semiconductor. Furthermore, the substrate 302 may include a semiconductor-on-insulator (SOI) structure. For example, the substrate 302 may include a buried oxide (BOX) layer formed by a process such as separation by implanted oxygen (SIMOX) or other suitable technique, such as wafer bonding and grinding.

Corresponding to operation 204, FIG. 3-2 is a cross-sectional view of the memory device 300, cut by a plane perpendicular to the Y direction, which includes an alternating series of first semiconductor layers 304, 308, and 312 and second semiconductor layers 306, 310, and 314, at one of the various stages of fabrication. The first semiconductor layers 304, 308, and 312 may include SiGe nanostructures (hereinafter "SiGe nanostructures 304, 308, and 312"), and the second semiconductor layers 306, 310, and 314 may include Si nanostructures (hereinafter "Si nanostructures 306, 310, and 314"). In some embodiments, each of the SiGe nanostructures 304, 308, and 312 may include a SiGe layer with a thickness in the nano-range (e.g., a SiGe nanosheet); and each of the Si nanostructures 306, 310, and 314 may include a Si layer with a thickness in the nano-range (e.g., a Si nanosheet). It is understood the thickness of the SiGe nanostructures 304, 308, and 312 and the Si nanostructures 306, 310, and 314 may be reduced to a sub-nano-range (e.g., angstroms), while remaining within the scope of the present disclosure. The alternating series of SiGe nanostructures 304, 308, and 312, and the Si nanostructures 306, 310, and 314 may be formed as a stack over the substrate 302, wherein the nanostructures 304-314 are disposed on top of one another along a vertical direction (e.g., the Z direction). Such a stack may sometimes be referred to as a superlattice. In a non-limiting example, a percentage of Ge in each of the SiGe nanostructures 304, 308, and 312 ranges from 10% to 40%. It is understood the percentage of Ge in each of the SiGe nanostructures 304, 308, and 312 can be any value between 0 and 100 (excluding 0 and 100), while remaining within the scope of the present disclosure.

The alternating series of nanostructures can be formed by epitaxially growing one layer and then the next until the desired number and desired thicknesses of the nanostructures are achieved. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. For epitaxial silicon, silicon germanium, and/or carbon doped silicon (Si: C) silicon can be doped during deposition (in-situ doped) by adding dopants, n-type dopants (e.g., phosphorus or arsenic) or p-type dopants (e.g., boron or gallium), depending on the type of transistor.

Corresponding to operation 206, FIG. 3-3 is a cross-sectional view of the memory device 300, cut by a plane perpendicular to the Y direction, that includes a first dummy gate stack 316a and second dummy gate stack 316b, at one of the various stages of fabrication. Each of the dummy gate stacks, 316a-b, includes a dummy gate and a hard mask. For example in FIG. 3-3, the first dummy gate stack 316a includes a dummy gate 318a formed over the Si nanostructure 314, and a hard mask 320a formed over the dummy gate 318a; and the second dummy gate stack 316b includes a dummy gate 318b formed over the Si nanostructure 314, and a hard mask 320b formed over the dummy gate 318b.

In some embodiments, the dummy gate stacks 316a-b may correspond to regions where the gate features of a programming transistor and reading transistor of the memory device 300 will be formed. Although each of the dummy gate stacks 316a-b is shown as a two-dimensional structure in FIG. 3-3, it is appreciated that the dummy gate stacks 316a-b are each formed as a three-dimensional structure to straddle the alternating series of first nanostructures 304, 308, and 312 and second nanostructures 306, 310, and 314. For example, each of the dummy gate stacks 316a-b may be formed over and around sidewalls of the first nanostructures 304, 308, and 312 and second nanostructures 306, 310, and 314. The dummy gates 318a-b can be formed by depositing amorphous silicon (a-Si) over and around the alternating series of first nanostructures 304, 308, and 312 and second nanostructures 306, 310, and 314. The a-Si is then planarized to a desired level. A hard mask (not shown) is deposited over the planarized a-Si and patterned to form the hard masks 320a-b. The hard masks 320a-b can be formed from a nitride or an oxide layer. An etching process (e.g., a reactive-ion etching (RIE) process) is applied to the a-Si to form the dummy gate stacks 316a-b.

After forming the dummy gate stacks 316a-b, gate spacers 322a and 322b may be formed to extend along respective sidewalls of the dummy gate stacks 316a and 316b, as illustrated in FIG. 3-3. The gate spacers 322a-b can be formed using a spacer pull down formation process. The gate spacers 322a-b can also be formed by a conformal deposition of a dielectric material (e.g., silicon oxide, silicon nitride, silicon oxynitride, SiBCN, SiOCN, SiOC, or any suitable combination of those materials) followed by a directional etch (e.g., RIE). Such gate spacers may sometimes be referred to as outer spacers. In some embodiments, the dummy gate stack 316a, together with the gate spacers 322a, may extend along a horizontal direction (e.g., the X direction) by a first distance, $D_1$; and the dummy gate stack 316b, together with the gate spacers 322b, may extend along the X direction by a second distance, $D_2$, as shown in FIG. 3-3. The first and second distances, $D_1$ and $D_2$, may be identical to or different from each other.

Figures 3, 4:
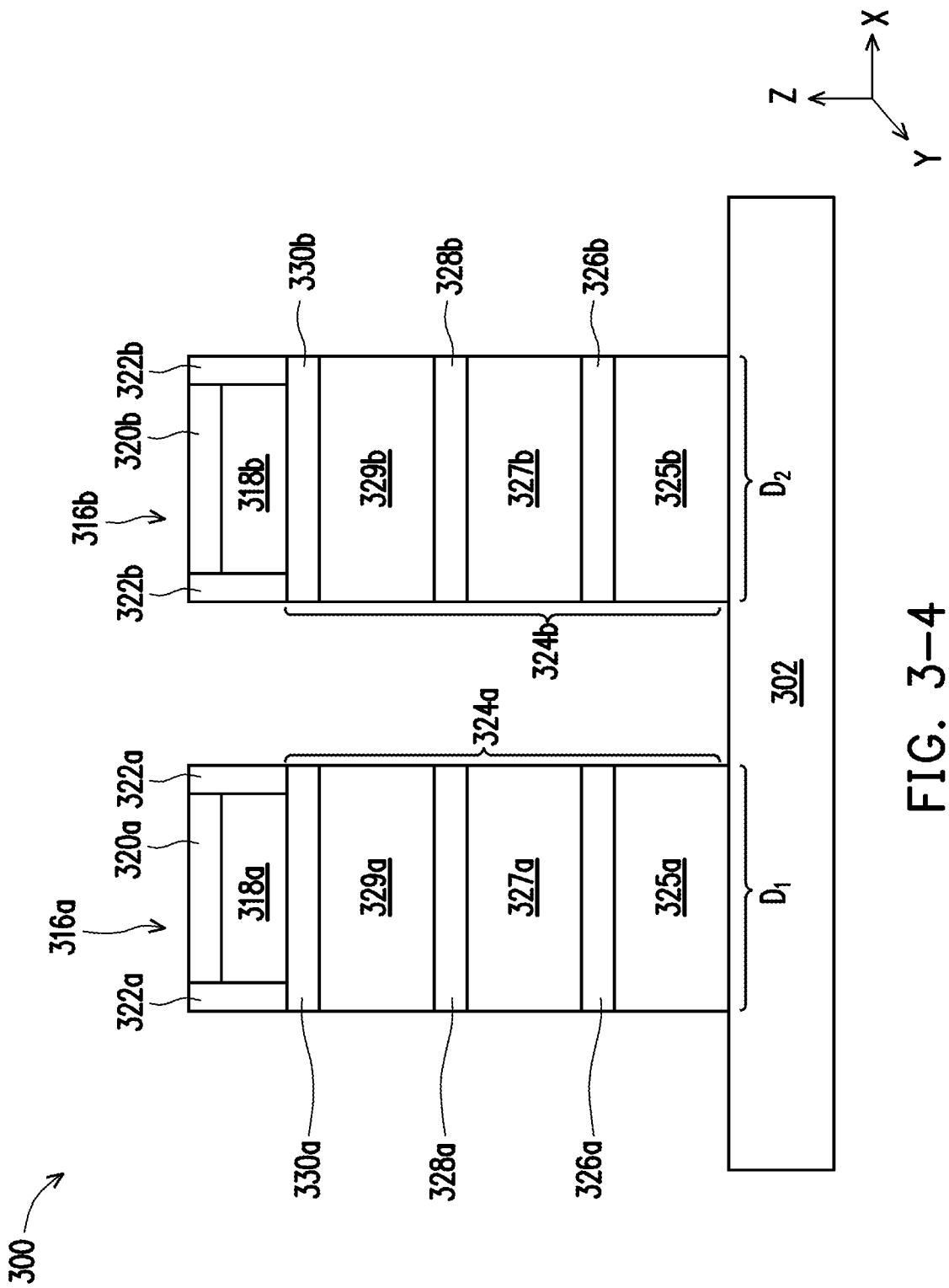

Corresponding to operation 208, FIG. 3-4 is a cross-sectional view of the memory device 300, cut by a plane perpendicular to the Y direction, which includes alternating-nanostructure columns 324a and 324b, at one of the various stages of fabrication. Subsequently to forming the gate spacers 322a-b, the alternating-nanostructure columns 324a and 324b may be formed by at least some of the following processes: using the gate spacers 322a-b, the dummy gates 318a-b, and the hard masks 320a-b as a mask to define the footprint of the alternating-nanostructure columns 324a and 324b, and etching the alternating series of first nanostructures 304, 308, and 312 and second nanostructures 306, 310, and 314 (shown in FIG. 3-3) to form the alternating-nanostructure columns 324a and 324b. As such, each of the alternating-nanostructure columns 324a and 324b includes a stack of alternating etched SiGe/Si nanostructures. For example, the alternating-nanostructure column 324a includes a stack of alternating etched SiGe nanostructure 325a, etched Si nanostructure 326a, etched SiGe nanostructure 327a, etched Si nanostructure 328a, etched SiGe nanostructure 329a, and etched Si nanostructure 330a; and the alternating-nanostructure column 324b includes a stack of alternating etched SiGe nanostructure 325b, etched Si nanostructure 326b, etched SiGe nanostructure 327b, etched Si nanostructure 328b, etched SiGe nanostructure 329b, and etched Si nanostructure 330b.

In some embodiments, each of the etched Si and SiGe nanostructures of the alternating-nanostructure columns 324a may follow the horizontal dimension of the dummy gate stack 316a and gate spacers 322a; and each of the etched Si and SiGe nanostructures of the alternating-nanostructure columns 324b may follow the horizontal dimension of the dummy gate stack 316b and gate spacers 322b. Accordingly, each of the etched Si and SiGe nanostructures of the alternating-nanostructure columns 324a may extend along the X direction by $D_1$; and each of the etched Si and SiGe nanostructures of the alternating-nanostructure columns 324b may extend along the X direction by $D_2$.

Figures 3, 4, 5:
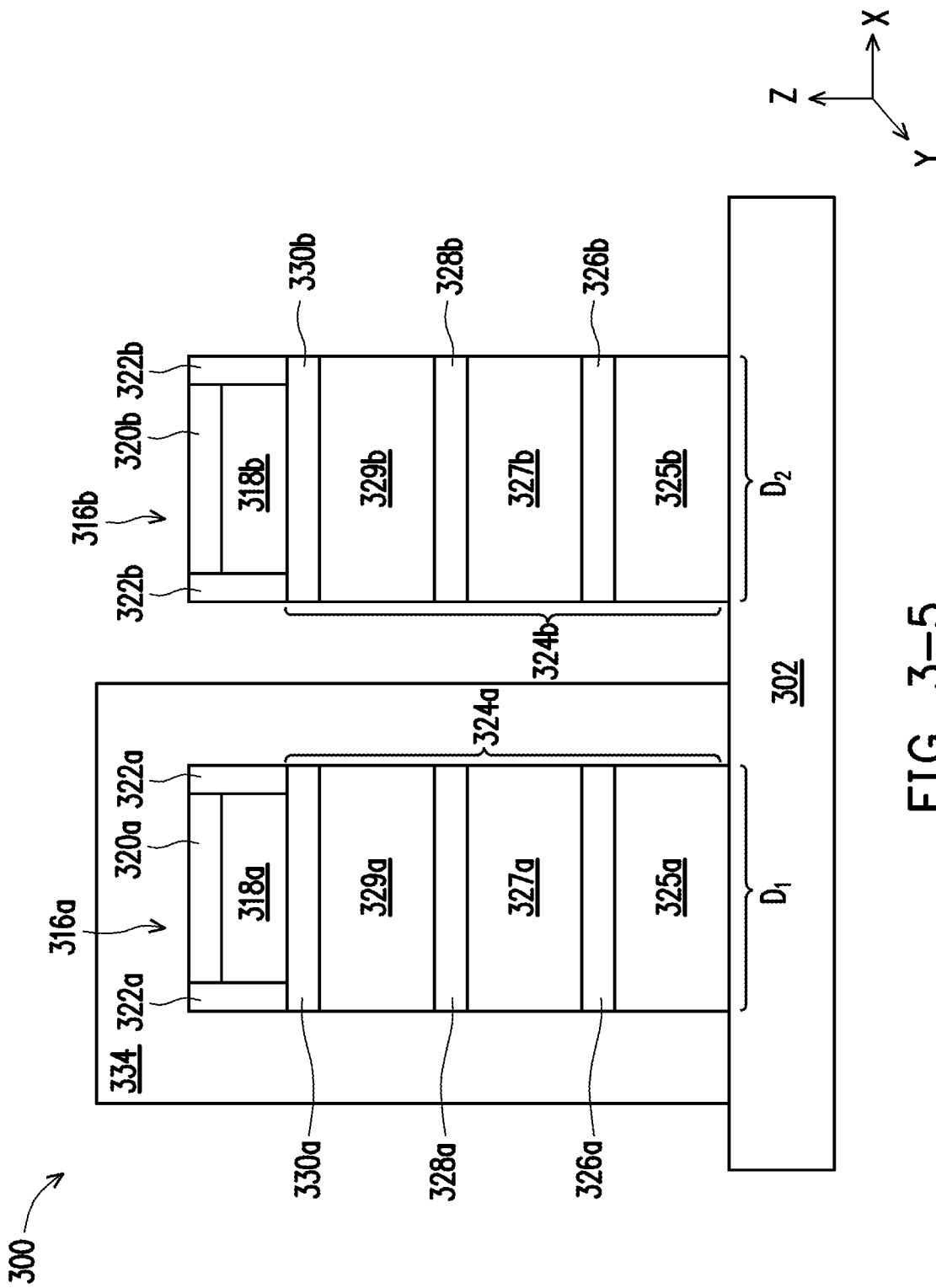

Corresponding to operation 210, FIG. 3-5 is a cross-sectional view of the memory device 300, cut by a plane perpendicular to the Y direction, that includes a blocking mask 334, at one of the various stages of fabrication. In some embodiments, the blocking mask 334 is formed to overlay the alternating-nanostructure columns 324a while remaining the alternating-nanostructure columns 324b exposed. The blocking mask 331 may be formed to have a sufficiently great thickness (or height) such that respective sidewalls of each of the etched SiGe nanostructures 325a, 327a, and 329a are fully covered. Formation of the blocking mask 334 may allow one or more processes, which shall be discussed below, to be performed on the alternating-nanostructure columns 324b. The blocking mask 334 may be formed of a material relatively resistant to etchants that can etch SiGe such as, for example, silicon oxide, silicon nitride, silicon oxynitride, SiBCN, SiOCN, SiOC, or any suitable combination of those materials.

Corresponding to operation 212, FIG. 3-6 is a cross-sectional view of the memory device 300, cut by a plane perpendicular to the Y direction, in which respective end portions of each of the etched SiGe nanostructure 325b, etched SiGe nanostructure 327b, and etched SiGe nanostructure 329b (shown in FIG. 3-5) are removed, at one of the various stages of fabrication. During the removal of the respective end portions of the etched SiGe nanostructure 325b, etched SiGe nanostructure 327b, and etched SiGe nanostructure 329b, the alternating-nanostructure columns 324a is covered by the blocking mask 334. As such, SiGe nanostructures 335b, 337b, and 339b can be formed to extend along the X direction by a distance less than $D_2$ (e.g., $D_3$), while the SiGe nanostructures 325a, 327a, and 329a of the alternating-nanostructure columns 324a still extend along the X direction by $D_1$. The SiGe nanostructures 325a, 327a, 329a, 335b, 337b, and 339b may be later replaced by a number of gate stacks. Thus, the SiGe nanostructures 325a, 327a, 329a may be herein referred to as SiGe sacrificial nanostructures 325a, 327a, 329a for the alternating-nanostructure columns 324a, and the SiGe nanostructures 335b, 337b, and 339b may be herein referred to as SiGe sacrificial nanostructures 335b, 337b, 339b for the alternating-nanostructure columns 324b.

In some embodiments of present disclosure, the end portions of the etched SiGe nanostructures 325b, 327b, and 329b can be removed using a first application, so called a "pull-back" process to pull the etched SiGe nanostructures 325b, 327b, and 329b back an initial pull-back distance such that the ends of the SiGe sacrificial nanostructures 335b, 337b, and 339b terminate underneath (e.g., aligned with) the gate spacers 322b. Although in the illustrated embodiment of FIG. 3-6, the ends of each of the SiGe sacrificial nanostructures 335b, 337b, and 339b are approximately aligned with the sidewalls of the spacer 322b, it is understood that the pull-back distance (i.e., the extent to which each of the SiGe sacrificial nanostructures 335b, 337b, and 339b is etched, or pulled-back) can be arbitrarily increased or decreased. The pull-back process may include a hydrogen chloride (HCl) gas isotropic etch process, which etches SiGe without attacking Si.

Corresponding to operation 214, FIG. 3-7 is a cross-sectional view of the memory device 300, cut by a plane perpendicular to the Y direction, that includes inner spacers 340, 342, and 344, at one of the various stages of fabrication. During the formation of the inner spacers 340-344, the alternating-nanostructure columns 324a is covered by the blocking mask 334. As such, only the alternating-nanostructure columns 324a has inner spacers 340-344 disposed along respective sidewalls of the SiGe sacrificial nanostructures 335b, 337b, and 339b. In some embodiments, the inner spacers 340-344 can be formed conformally by chemical vapor deposition (CVD), or by monolayer doping (MLD) of nitride followed by spacer RIE. In some other embodiments, the inner spacers 340-344 can be deposited using, e.g., a conformal deposition process and subsequent isotropic or anisotropic etch back to remove excess spacer material on vertical sidewalls of the alternating-nanostructure column 324b and on a surface of the semiconductor substrate 302. Accordingly, the inner spacers 340-344 may extend along the X direction by a distance $D_4$, that is about one half of the difference between $D_2$ and $D_3$. A material of the inner spacers 340-344 can be formed from the same or different material as the gate spacer 322a-b (e.g., silicon nitride). For example, the inner spacers 340-344 can be formed of silicon nitride, silicoboron carbonitride, silicon carbonitride, silicon carbon oxynitride, or any other type of dielectric material (e.g., a dielectric material having a dielectric constant k of less than about 5) appropriate to the role of forming an insulating gate sidewall spacers of FET devices.

Corresponding to operation 216, FIG. 3-8 is a cross-sectional view of the memory device 300, cut by a plane perpendicular to the Y direction, that includes drain feature 346, source feature 348, drain feature 350, and source feature 352, at one of the various stages of fabrication. The drain/source features 346-352 may be formed after the blocking mask 334 (shown in FIG. 3-7) is removed. In some embodiments, the drain feature 346 may be formed using an epitaxial layer growth process on the exposed ends of the etched Si nanostructures 326a, 328a, and 330a on the right-hand side of the alternating-nanostructure column 324a. The source 348 may be formed using an epitaxial layer growth process on the exposed ends of the etched Si nanostructures 326a, 328a, and 330a on the left-hand side of the alternating-nanostructure column 324a. The drain 350 may be formed using an epitaxial layer growth process on the exposed ends of the etched Si nanostructures 326b, 328b, and 330b on the left-hand side of the alternating-nanostructure column 324b. The source 352 is formed using an epitaxial layer growth process on the exposed ends of the etched Si nanostructures 326b, 328b, and 330b on the right-hand side of the alternating-nanostructure column 324b. In some embodiments, the source 348 and drain 350 may be merged with each other to form a continuous feature or region, as shown in FIG. 3-8.

According to some embodiments, the drain feature 346 and source feature 348 are electrically coupled to the Si nanostructures 326a, 328a, and 330a; and the drain feature 350 and source feature 352 are electrically coupled to the Si nanostructures 326b, 328b, and 330b. The Si nanostructures 326a, 328a, and 330a may collectively constitute the conduction channel of a first transistor 354a; and the Si nanostructures 326b, 328b, and 330b may collectively constitute the conduction channel of a second transistor 354b. In an example where the memory device is an anti-fuse cell, the first transistor 354a may function as a programming transistor, and the second transistor 354b may function as a reading transistor, electrically connected to the programming transistor 354a in series.

In-situ doping (ISD) may be applied to form the doped drain/source features 346-352, thereby creating the necessary junctions for the programming transistor 354a and reading transistor 354b. N-type and p-type FETs are formed by implanting different types of dopants to selected regions (e.g., drain/source features 346-352) of the device to form the necessary junction(s). N-type devices can be formed by implanting arsenic (As) or phosphorous (P), and p-type devices can be formed by implanting boron (B).

Corresponding to operation 218, FIG. 3-9 is a cross-sectional view of the memory device 300, cut by a plane perpendicular to the Y direction, that includes an inter-layer dielectric (ILD) material 356, at one of the various stages of fabrication. The ILD material 356 can be formed by depositing an oxide material in bulk (e.g., silicon dioxide) and polishing the bulk oxide back (e.g., using CMP) to the level of the gate spacers 322a-b and the hard masks 320a-b.

Corresponding to operation 220, FIG. 3-10 is a cross-sectional view of the memory device 300, cut by a plane perpendicular to the Y direction, in which the dummy gate stacks 316a-b (FIG. 3-9) are removed, at one of the various stages of fabrication. Subsequently to forming the protective ILD material 356, the dummy gate stacks 316a (including the dummy gate 318a and hard mask 320a) and 316b (including the dummy gate 318b and hard mask 320b), shown in FIG. 3-9, are removed. The dummy gate stacks 316a-b can be removed by a known etching process, e.g., RIE or chemical oxide removal (COR).

After the removal of the dummy gate stacks 316a-b, respective top boundaries of the alternating-nanostructure columns 324a and 324b may be again exposed. Specifically, respective top boundaries of the etched Si nanostructures 330a of the alternating-nanostructure column 324a and the etched Si nanostructures 330b of the alternating-nanostructure column 324b may be exposed. Although not shown in the cross-sectional view of FIG. 3-10, it is appreciated that in addition to the top boundaries, the respective sidewalls of the alternating-nanostructure columns 324a and 324b, along the Y direction, may also be exposed.

Corresponding to operation 222, FIG. 3-11 is a cross-sectional view of the memory device 300, cut by a plane perpendicular to the Y direction, in which the SiGe sacrificial nanostructures 325a, 327a, and 329a of the alternating-nanostructure column 324a and SiGe sacrificial nanostructures 335b, 337b, and 339b of the alternating-nanostructure column 324b (shown in FIG. 3-10) are removed, at one of the various stages of fabrication. The SiGe sacrificial nanostructures 325a, 327a, 329a, 335b, 337b, and 339b can be removed by applying a selective etch (e.g., a hydrochloric acid (HCl)).

After the removal of the SiGe sacrificial nanostructures 325a, 327a, 329a, 335b, 337b, and 339b, respective bottom boundaries of the etched Si nanostructures 326a, 328a, and 330a of the alternating-nanostructure column 324a and the etched Si nanostructures 326b, 328b, and 330b of the alternating-nanostructure column 324b may be exposed. As mentioned above, the etched Si nanostructures 326a, 328a, and 330a of the alternating-nanostructure column 324a may be collectively configured as a conduction channel of the programming transistor 354a; and the etched Si nanostructures 326b, 328b, and 330b of the alternating-nanostructure column 324b may be collectively configured as a conduction channel of the reading transistor 354b. As such, the etched Si nanostructures 326a, 328a, and 330a may herein be referred to as "conduction channel 360a;" and the etched Si nanostructures 326b, 328b, and 330b may herein be referred to as "conduction channel 360b."

The conduction channels 360a and 360b are configured to conduct current flowing through the programming transistor 354a and reading transistor 354b, respectively. In general, such a conduction channel has a length and a width. The length may be in parallel with the current, and the width may be perpendicular to the current. As shown in FIG. 3-11, the conduction channel 360a may be characterized with a length of about $D_1$, and the conduction channel 360b may be characterized with a length of about $D_2$. Although three Si nanostructures are formed as the conduction channels of the programming transistor 354a and reading transistor 354b of the memory device 300, it is understood that a memory device, fabricated by the method disclosed herein, can include any number of nanostructures to form its conduction channel(s) while remaining within the scope of the present disclosure.

Corresponding to operation 224, FIG. 3-12 is a cross-sectional view of the memory device 300, cut by a plane perpendicular to the Y direction, that includes gate dielectrics 364a and 364b, at one of the various stages of fabrication. As shown, the gate dielectric 364a can wrap around each of the Si nanostructures of the conduction channel 360a (the Si nanostructures 326a, 328a, and 330a); and the gate dielectric 364b can wrap around each of the Si nanostructures of the conduction channel 360b (the Si nanostructures 326a, 328b, and 330b). The gate dielectrics 364a and 364b include different high-k dielectric materials or an identical high-k dielectric material. The gate dielectrics 364a and 364b may include a stack of multiple high-k dielectric materials. The gate dielectrics 364a and 364b can be deposited using any suitable method, including, for example, atomic layer deposition (ALD). In some embodiments, the gate dielectrics 364a and 364b may optionally include a substantially thin oxide (e.g., $SiO_x$) layer. In some embodiments, the gate dielectric 364a-b may be formed as substantially conformal layers characterized with a thickness $D_5$ and a thickness $D_6$, respectively.

Corresponding to operation 226, FIG. 3-13 is a cross-sectional view of the memory device 300, cut by a plane perpendicular to the Y direction, that includes gate metals 366a and 366b, at one of the various stages of fabrication. In some embodiments, the gate 366a can wrap around each of the Si nanostructures of the conduction channel 360a with the gate dielectric 364a disposed therebetween; and the gate 366b can wrap around each of the Si nanostructures of the conduction channel 360b with the gate dielectric 364b disposed therebetween. The gate metals 366a-b may be formed of different metal materials or an identical metal material. The gate metals 366a-b may each include a stack of multiple metal materials. The gate metals 366a-b can be deposited using any suitable method, including, for example, CVD.

Although the gate metals 366a-b are each shown as a two-dimensional structure in FIG. 3-13, it is appreciated that the gate metals 366a-b are each formed as a three-dimensional structure. Specifically, the gate metals 366a-b can each include a number of gate metal sections spaced apart from each other along the Z direction. Each of the gate metal sections can extend not only along a horizontal plane (e.g., the plane expanded by the X direction and the Y direction), but also along a vertical direction (e.g., the Z direction). As such, two adjacent ones of the gate metal sections can adjoin each other so as to wrap around a corresponding Si nanostructure, with a gate dielectric disposed therebetween.

For example in FIG. 3-13, the gate metal 366a can include gate metal sections 366a1, 366a2, 366a3, and 366a4. The gate metal sections 366a1 and 366a2 may adjoin each other to wrap around the Si nanostructure 330a, with a portion of the gate dielectric 364a disposed therebetween. The gate metal sections 366a2 and 366a3 may adjoin each other to wrap around the Si nanostructure 328a, with a portion of the gate dielectric 364a disposed therebetween. The gate metal sections 366a3 and 366a4 may adjoin each other to wrap around the Si nanostructure 326a, with a portion of the gate dielectric 364a disposed therebetween. Similarly, the gate metal 366b can include gate metal sections 366b1, 366b2, 366b3, and 366b4. The gate metal sections 366b1 and 366b2 may adjoin each other to wrap around the Si nanostructure 330b, with a portion of the gate dielectric 364b disposed therebetween. The gate metal sections 366b2 and 366b3 may adjoin each other to wrap around the Si nanostructure 328b, with a portion of the gate dielectric 364b disposed therebetween. The gate metal sections 366b3 and 366b4 may adjoin each other to wrap around the Si nanostructure 326b, with a portion of the gate dielectric 364b disposed therebetween. In some embodiments, such a gate metal section, together with the corresponding portion of the gate dielectric, that at least partially wrap around one of the Si nanostructures may be collectively referred to as a gate stack. The gate stack is operatively associated with the wrapped Si nanostructure (e.g., modulating the current conducting in the Si nanostructure). The gate stack may sometimes be referred to as an all-around gate stack.

In some embodiments, a number of gate stacks, constituted by the sections of the gate metal 366a and gate dielectric 364a, may function as a gate feature of the programming transistor 354a to modulate the current conducting from the drain feature 346, through the conduction channel 360a, and to the source feature 348; and a number of gate stacks, constituted by the sections of the gate metal 366b and gate dielectric 364b, may function as a gate feature of the reading transistor 354b to modulate the current conducting from the drain feature 350, through the conduction channel 360b, and to the source feature 352.

In the illustrated embodiments of FIGS. 3-1 to 3-13, no inner spacers are formed in the alternating-nanostructure columns 324a, the gate stacks of the programming transistor 354a may be in direct contact with the respective drain and source features, 346 and 348. As such, each of the Si nanostructures (e.g., 326a, 328a, 330a) of the conduction channel 360a may extend along the X direction by a distance (or length) substantially equal to a distance (or length) by which each of the gate stacks extends along the X direction (e.g., about $D_1$). The distance by which the conduction channel 360a extends along the X direction may sometimes be referred to as a channel length of the programming transistor 354a. Specifically, each of the gate metal sections 366a2-4 may be electrically coupled to the drain/source features 346 and 348 with the gate dielectric 364a disposed therebetween. As such, a distance by which each of the gate metal sections 366a2-4 extends along the X direction is about $D_1-2\times D_5$.

On the other hand, the inner spacers 340-344 are formed in the alternating-nanostructure columns 324b, the gate stacks of the reading transistor 354b may be electrically isolated from the respective drain and source features, 350 and 352 by the inner spacers 340-344. As such, each of the Si nanostructures (e.g., 326b, 328b, 330b) of the conduction channel 360b may extend along the X direction by a distance (or length), e.g., about $D_1$, substantially greater than a distance (or length) by which each of the gate stacks extends along the X direction (e.g., about $D_2-2\times D_4$). The distance by which the conduction channel 360b extends along the X direction may sometimes be referred to as a channel length of the reading transistor 354b. Specifically, each of the gate metal sections 366b2-4 may be electrically isolated from the drain/source features 350 and 352 with the gate dielectric 364b and the respective one of the inner spacers 340-344 disposed therebetween. As such, a distance by which each of the gate metal sections 366b2-4 extends along the X direction is about $D_2-2\times D_4-2\times D_6$.

By forming the programming transistor and reading transistor of a memory cell in such a configuration, the contact area of each of the gate stacks to the source/drain features for the programming transistor can be increased, which may advantageously reduce $V_{BD}$ and $T_{BD}$ of the programming transistor. Concurrently, keeping the inner spacers for the reading transistor, the parasitic capacitances can be effectively suppressed so as not to compromise switching speed of the reading transistor.

After forming the gate metals 366a-b, one or more interconnection structures may be formed to connect each of the gate metal 366a, the gate metal 366b, and the source feature 352 to connect the memory device 300 to other components or devices. For example, one or more interconnection structures (e.g., a via structure typically known as VG) may be formed over the gate metal 366a to connect it to one or more upper metal layers, which may include a programming word line (WLP); one or more interconnection structures (e.g., VG) may be formed over the gate metal 366b to connect it to one or more upper metal layers, which may include a reading word line (WLR); and one or more interconnection structures (e.g., a metal structure typically known as MD, a via structure typically known as VD)) may be formed in or over the ILD 356 and over the source feature 352 to connect it to one or more upper metal layers, which may include a bit line (BL). As such, the memory device 300, as an example anti-fuse memory cell, can be connected to one or more other memory cells similar to the memory device 300. For example, a number of such memory device 300 may be arranged (e.g., coupled) to each other by respective WLPs, reading WLs, and BLs to form a memory array.

FIG. 4 illustrates a cross-sectional view of another example memory device 400, in accordance with some embodiments. The memory device 400 may be substantially similar to the memory device 300 (FIGS. 3-1 to 3-13) except that both of the programming transistor and reading transistor of the memory device 400 include inner spacers. Thus, the following discussions shall be focused on the difference between the memory devices 300 and 400.

As shown, the memory device 400 includes a programming transistor 404a and reading transistor 404b formed on a substrate 402. Similar to the programming transistor 354a, the programming transistor 404a also includes a gate metal 406a, a gate dielectric 408a, gate spacers 409a, a number of Si nanostructures collectively functioning as a conduction channel 410a, a drain feature 412, and a source feature 414. Similar to the reading transistor 354b, the reading transistor 404b also includes a gate metal 406b, a gate dielectric 408b, gate spacers 409b, a number of Si nanostructures collectively functioning as a conduction channel 410b, a drain feature 416, and a source feature 418. At least a portion of each of the programming transistor 404a and reading transistor 404b is embedded in an ILD 420.

Different from the memory device 300, both of the programming transistor 404a and reading transistor 404b include inner spacers. Specifically, the gate metal 406a of the programming transistor 404a includes gate metal sections 406a1, 406a2, 406a3, and 406a4. The gate metal section 406a1 and a portion of the gate dielectric 408a may constitute a first one of a number of gate stacks for the programming transistor 404a; the gate metal section 406a2 and a portion of the gate dielectric 408a may constitute a second one of the gate stacks for the programming transistor 404a; the gate metal section 406a3 and a portion of the gate dielectric 408a may constitute a third one of the gate stacks for the programming transistor 404a; and the gate metal section 406a4 and a portion of the gate dielectric 408a may constitute a fourth one of the gate stacks for the programming transistor 404a. Each of the gate stacks can at least partially wrap around a corresponding Si nanostructure of the conduction channel 410a.

Similarly, the gate metal 406b of the reading transistor 404b includes gate metal sections 406b1, 406b2, 406b3, and 406b4. The gate metal section 406b1 and a portion of the gate dielectric 408b may constitute a first one of a number of gate stacks for the reading transistor 404b; the gate metal section 406b2 and a portion of the gate dielectric 408b may constitute a second one of the gate stacks for the reading transistor 404b; the gate metal section 406b3 and a portion of the gate dielectric 408b may constitute a third one of the gate stacks for the reading transistor 404b; and the gate metal section 406b4 and a portion of the gate dielectric 408b may constitute a fourth one of the gate stacks for the reading transistor 404b. Each of the gate stacks can at least partially wrap around a corresponding Si nanostructure of the conduction channel 410b.

Some of the gate stacks of the programming transistor 404a are isolated from the respective drain/source features, 412 and 414, by inner spacers 424, for example, the gate stack including the gate metal section 406a2, the gate stack including the gate metal section 406a3, and the gate stack including the gate metal section 406a4. Some of the gate stacks of the reading transistor 404b are isolated from the respective drain/source features, 416 and 418, by inner spacers 426, for example, the gate stack including the gate metal section 406b2, the gate stack including the gate metal section 406b3, and the gate stack including the gate metal section 406b4. In some embodiments, the inner spacers 424-426 may be formed of a dielectric material selected from: silicon oxide, silicon nitride, silicon oxynitride, SiBCN, SiOCN, SiOC, or a combination thereof.

To the extent of reducing $V_{BD}/T_{BD}$ of the programming transistor 404a while suppressing the parasitic capacitances of the reading transistor 404b, the inner spacers 424 and 426 have different effective capacitance. In some embodiments a thickness of inner spacers 424 is substantially equal to that of inner spacers 426, but a dielectric constant of inner spacers 424 is different from that of inner spacers 426. For example, the inner spacers 424 may be formed of a dielectric material characterized with a dielectric constant higher than the dielectric constant of a dielectric material of the inner spacers 426. In another example, the inner spacers 424 and 426 may be formed to have different geometric dimensions. Each of the inner spacers 424 may extend along the X direction by a distance (sometimes referred to as inner spacers' width), $D_7$, and along the Z direction by a distance (sometimes referred to inner spacers' height), $D_9$; and each of the inner spacers 426 may extend along the X direction by a distance (width), $D_8$, and along the Z direction by a distance (height), $D_{10}$. In some embodiments, a sum of the $D_7$'s of the inner spacers 424 may be selected to be less than a sum of the $D_8$'s of the inner spacers 426; and/or a sum of the $D_9$s of the inner spacers 424 may be selected to be less than a sum of the $D_{10}$s of the inner spacers 426. In at least one embodiment, inner spacers 424 and inner spacers 426 have different geometric dimensions but have a same dielectric constant.

Given a non-zero thickness of the inner spacers 424 and 426, each of the Si nanostructures of the conduction channels 410a-b may be characterized with a channel length greater than a distance by which the corresponding gate stacks extend along the X direction. For example in FIG. 4, the Si nanostructures of the conduction channel 410a may have a channel length of $D_{11}$ greater than a distance by which the corresponding gate stacks extend along the X direction (e.g., $D_{11}-2 \times D_7$). In another example, the Si nanostructures of the conduction channel 410b may have a channel length of $D_{12}$ greater than a distance by which the corresponding gate stacks extend along the X direction (e.g., $D_{12}-2 \times D_8$).

To make the memory device 400, a method substantially similar to the method 200 of FIG. 2 may be used. For example, operation 210 may be skipped. As such, the first alternating-nanostructure column is also exposed while removing end portions of the first nanostructures of the first alternating-nanostructure column (operation 212). Further, operation 212 may be changed to remove end portions of the first nanostructures of both of the first and second alternating-nanostructure columns.

Figures 3, 4, 5, 6:
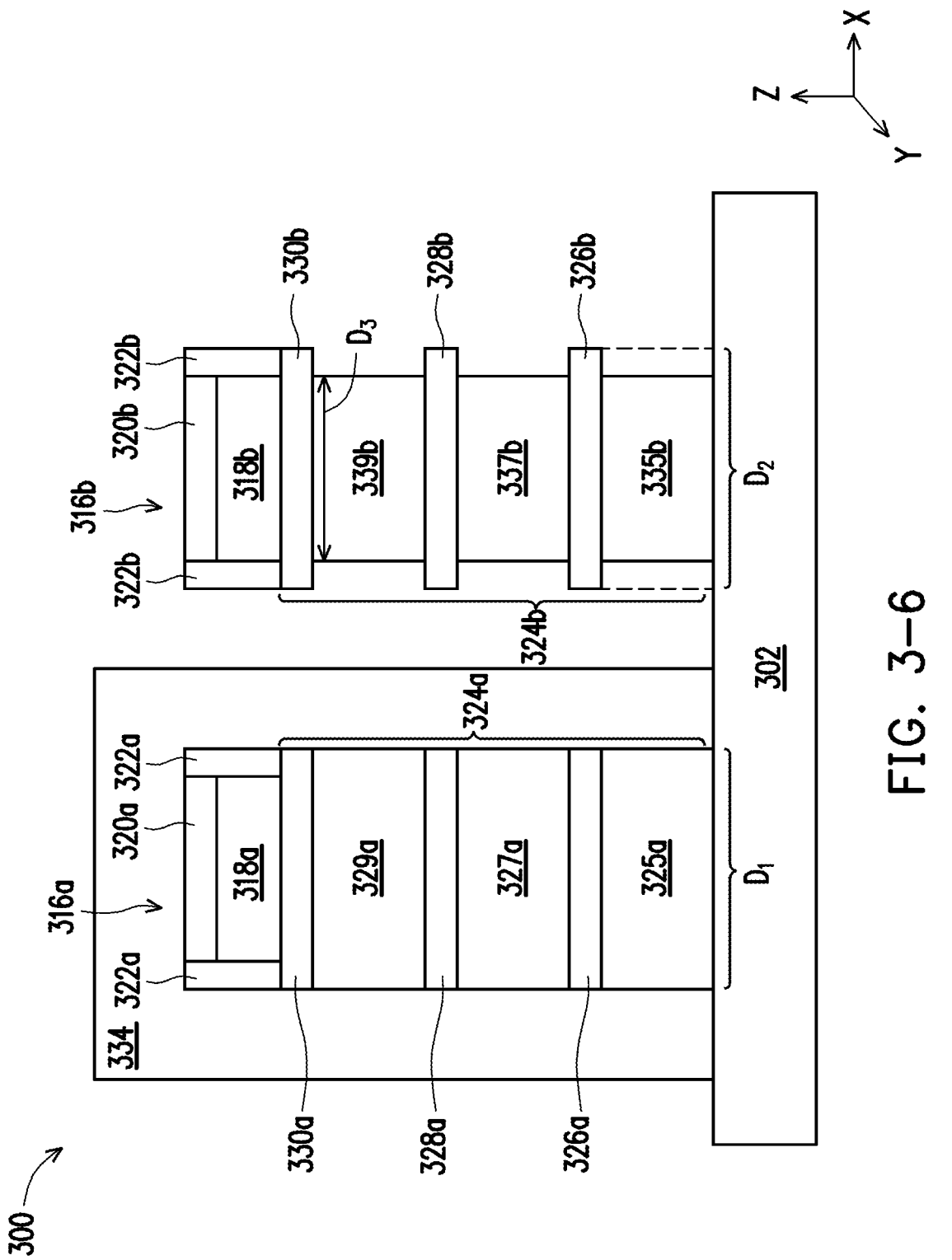
Figures 3, 4, 5, 6, 7:
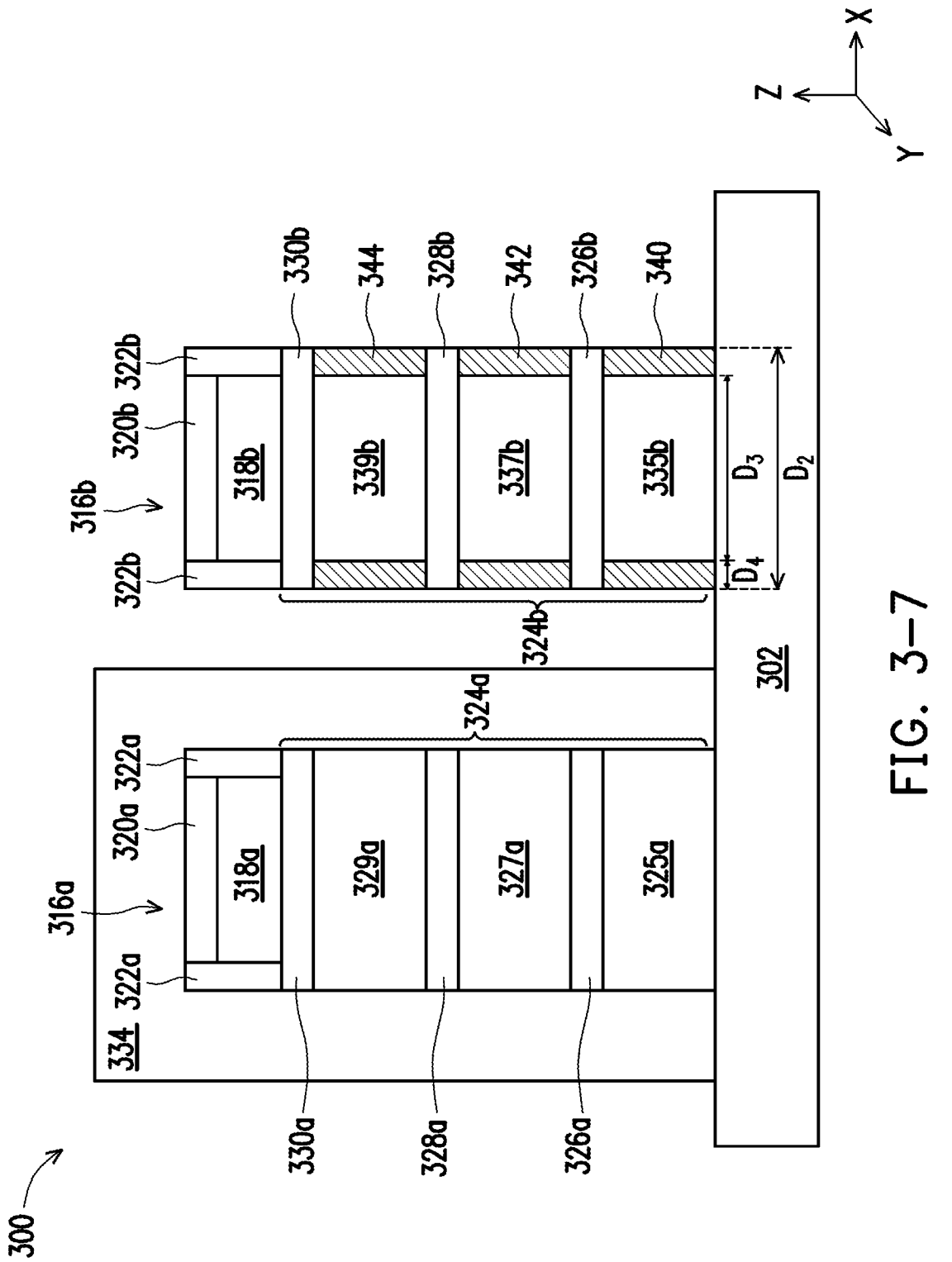
Figures 3, 4, 5, 6, 7, 8:
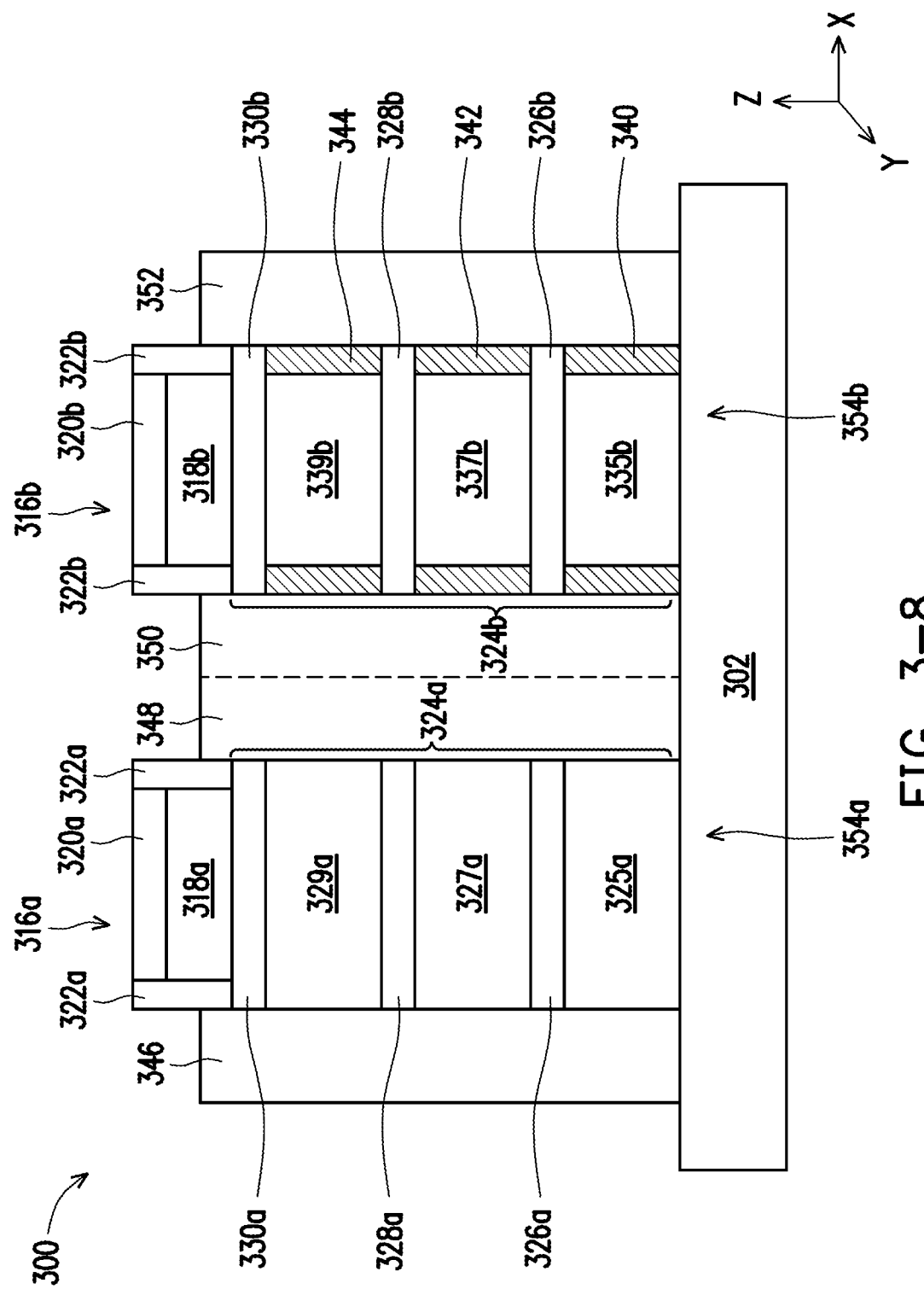
Figures 3, 4, 5, 6, 7, 8, 9:
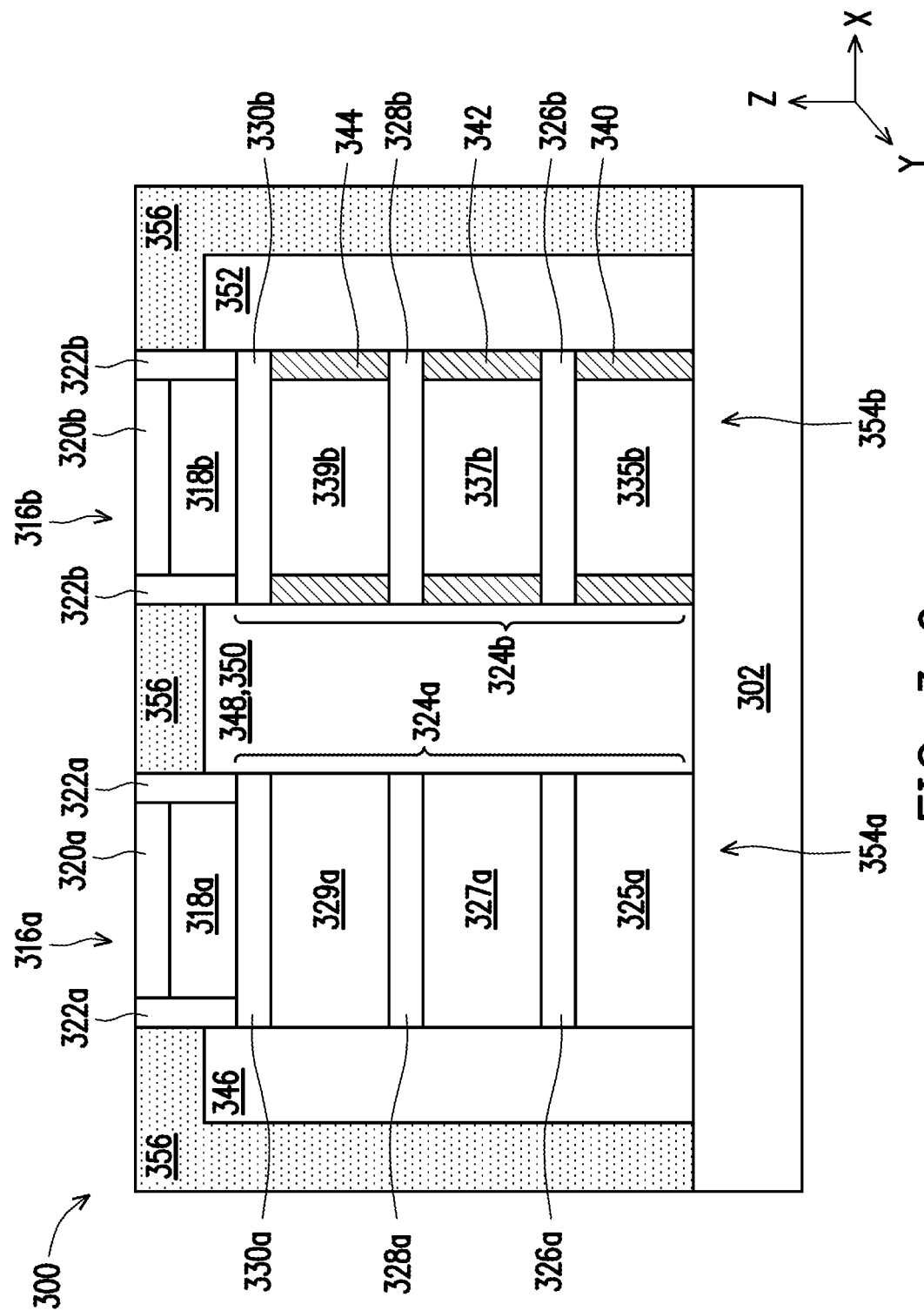
Figures 3, 4, 5, 6, 7, 8, 9, 10:
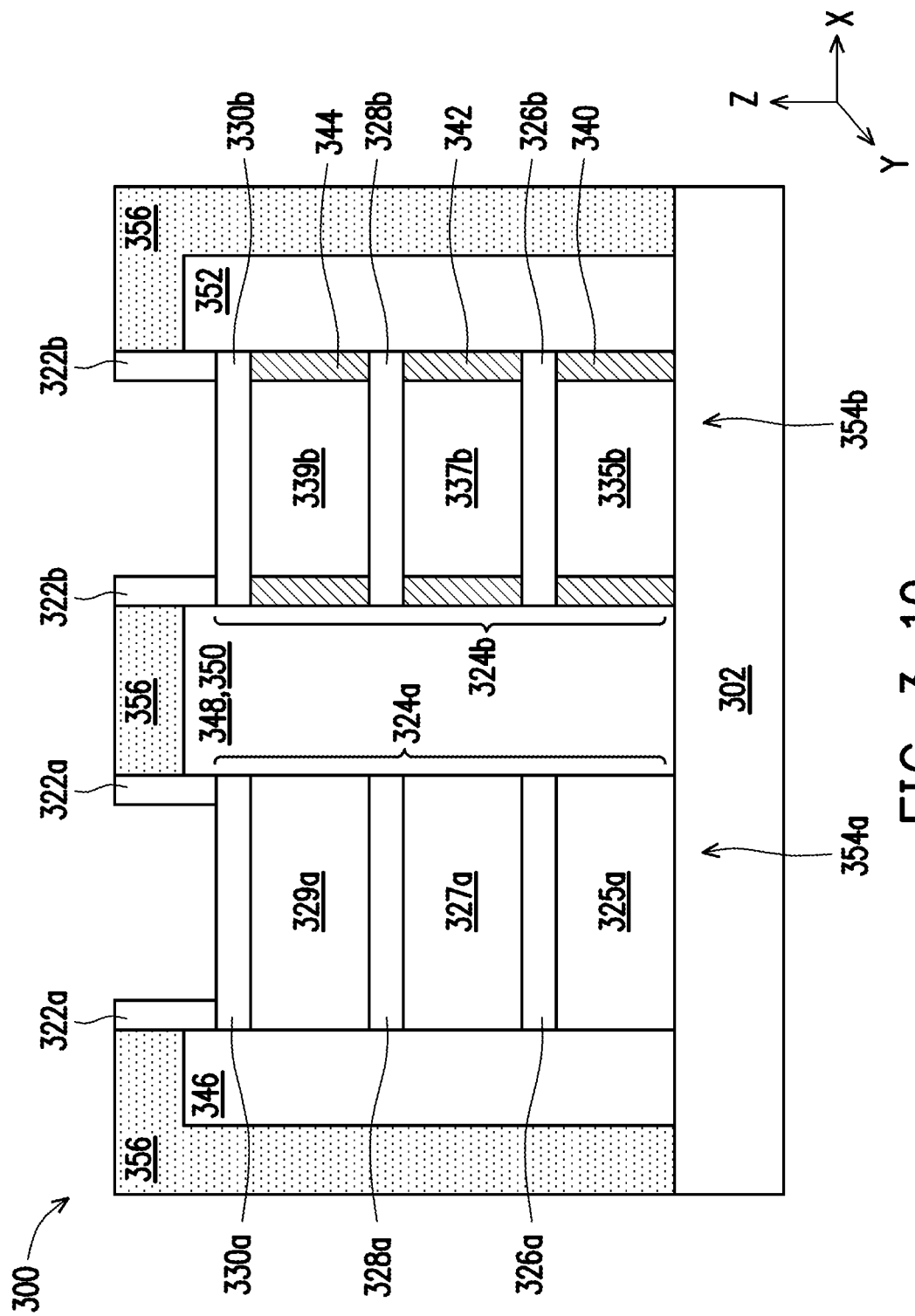
Figures 3, 4, 5, 6, 7, 8, 9, 10, 11:
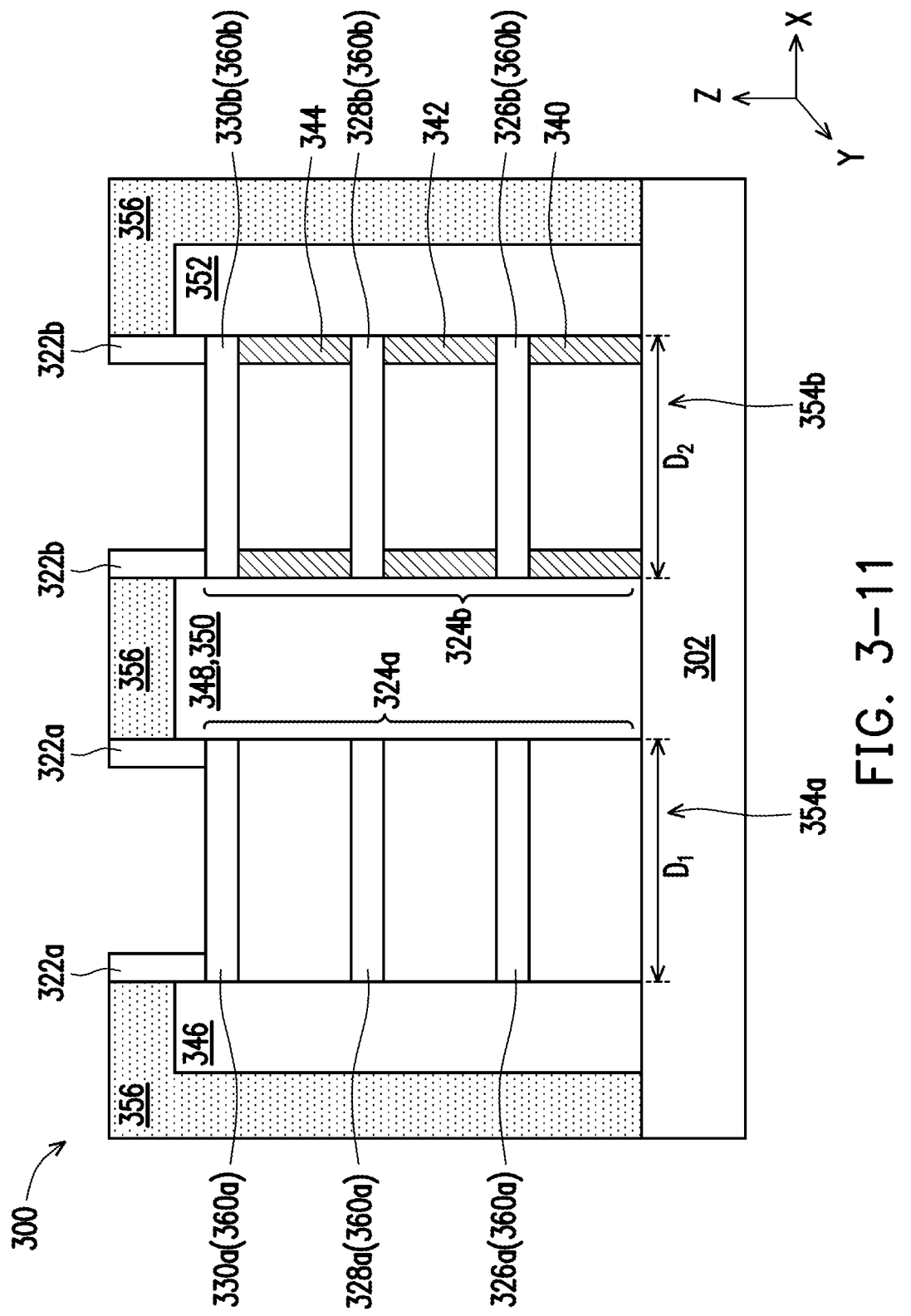
Figures 3, 4, 5, 6, 7, 8, 9, 10, 11, 12:
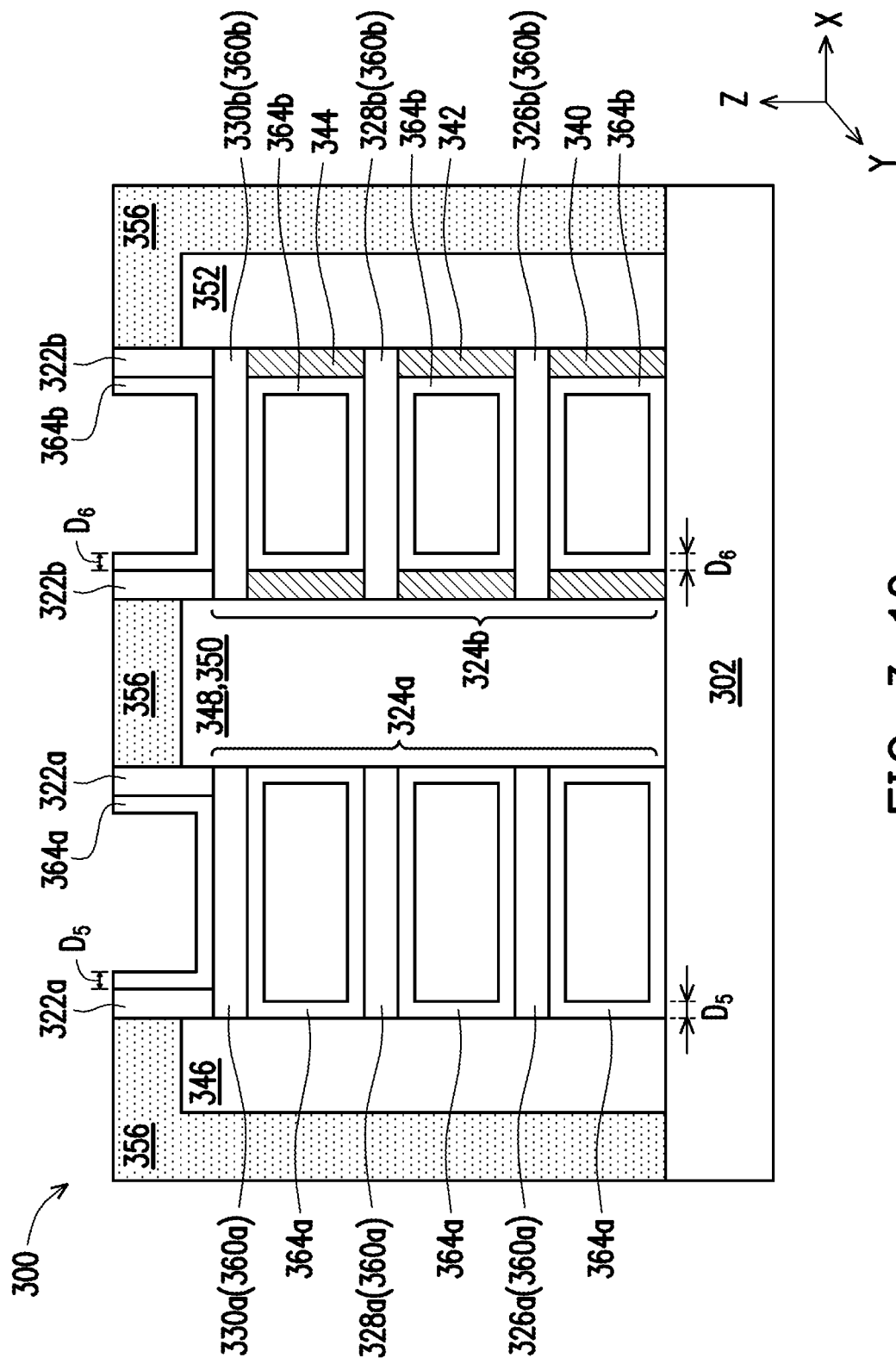
Figures 3, 4, 5, 6, 7, 8, 9, 10, 11, 12, 13:
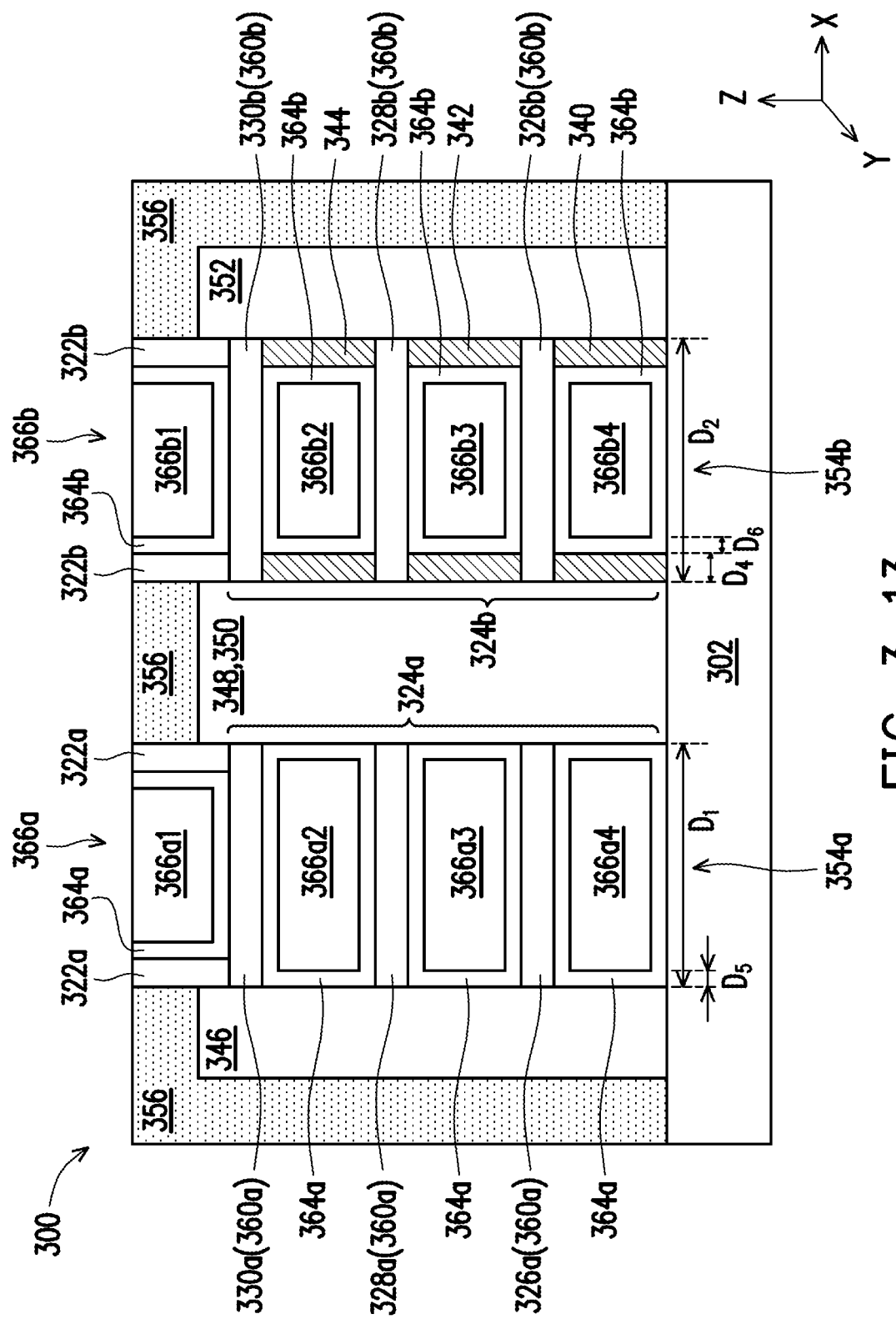
Figure 4:
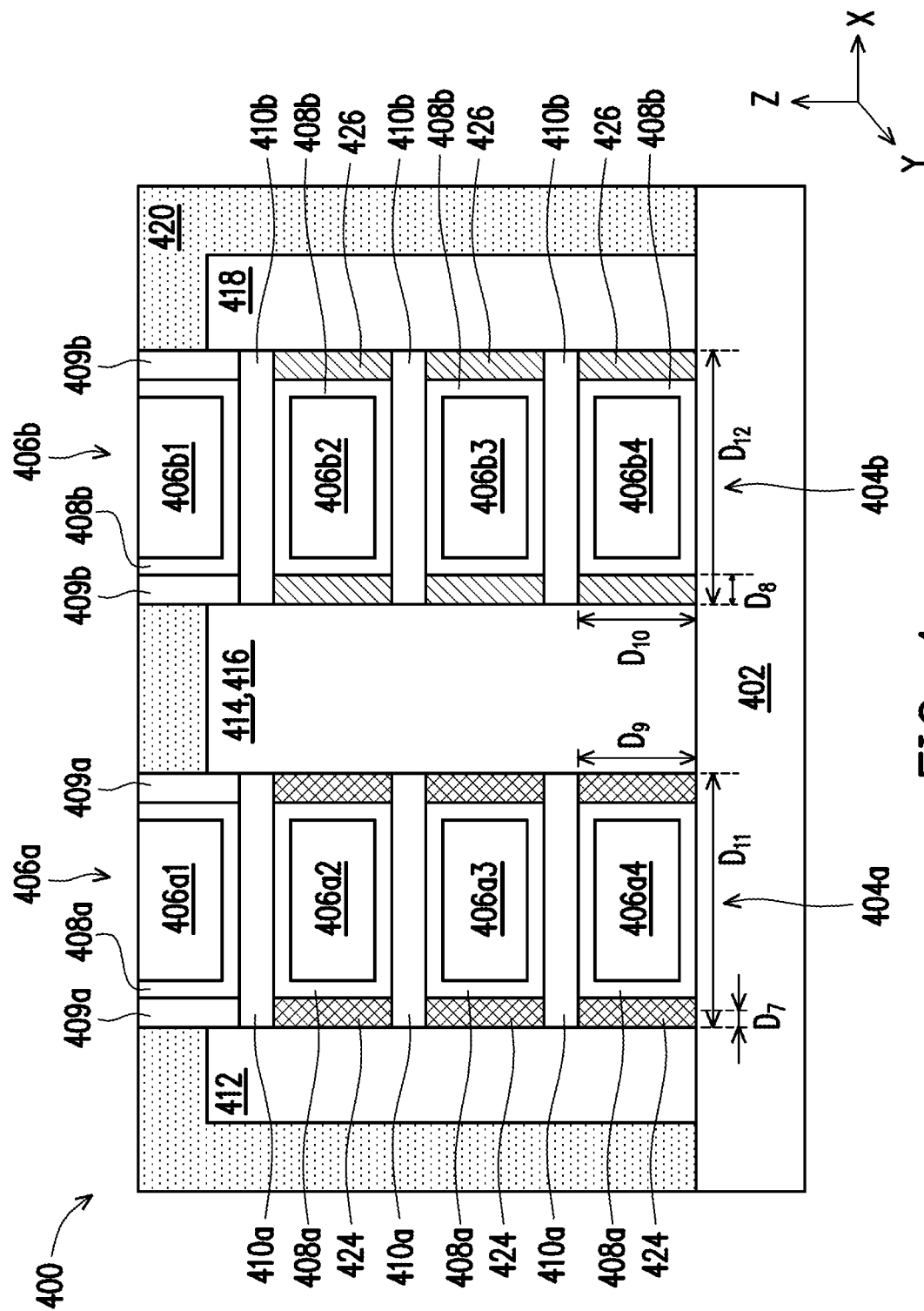
Figure 5:
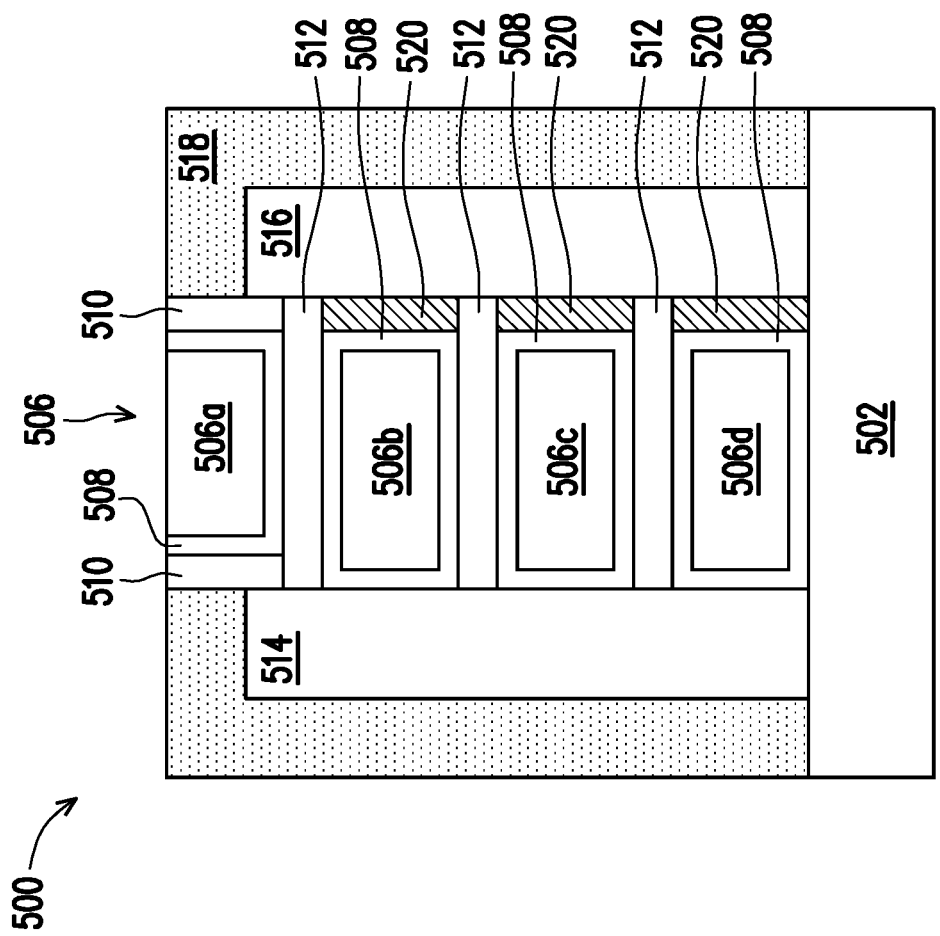
Figure 6:
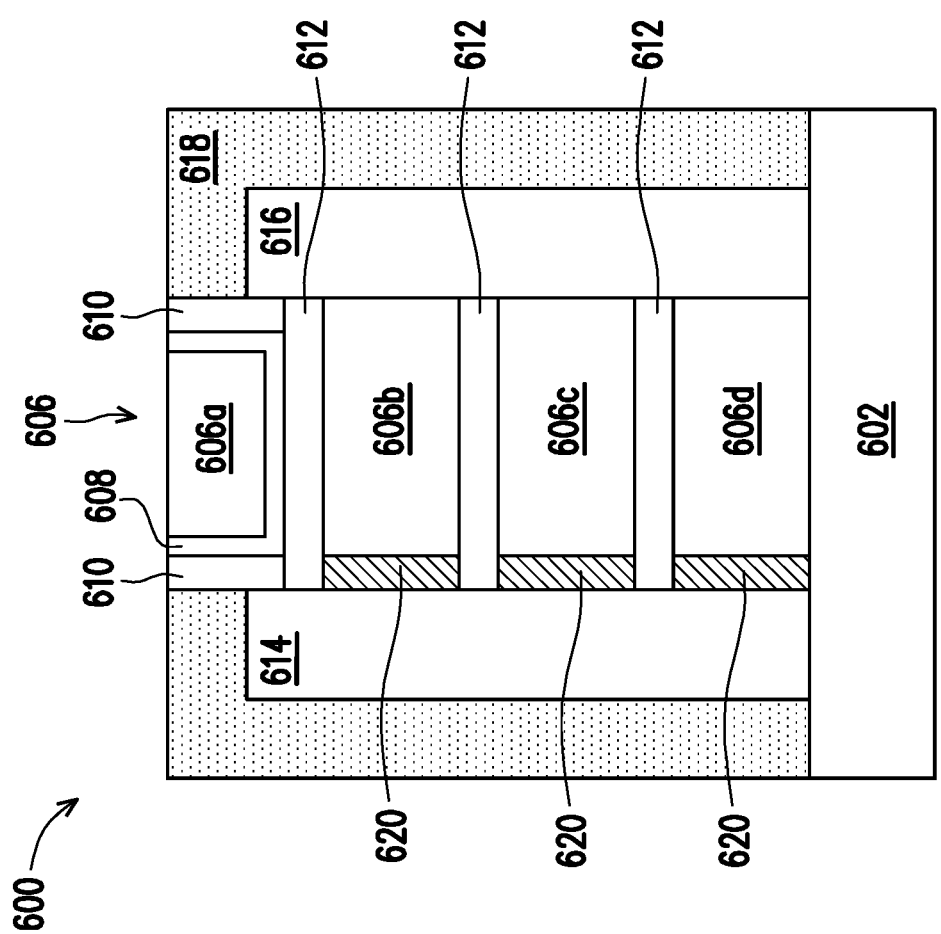
Figure 7:
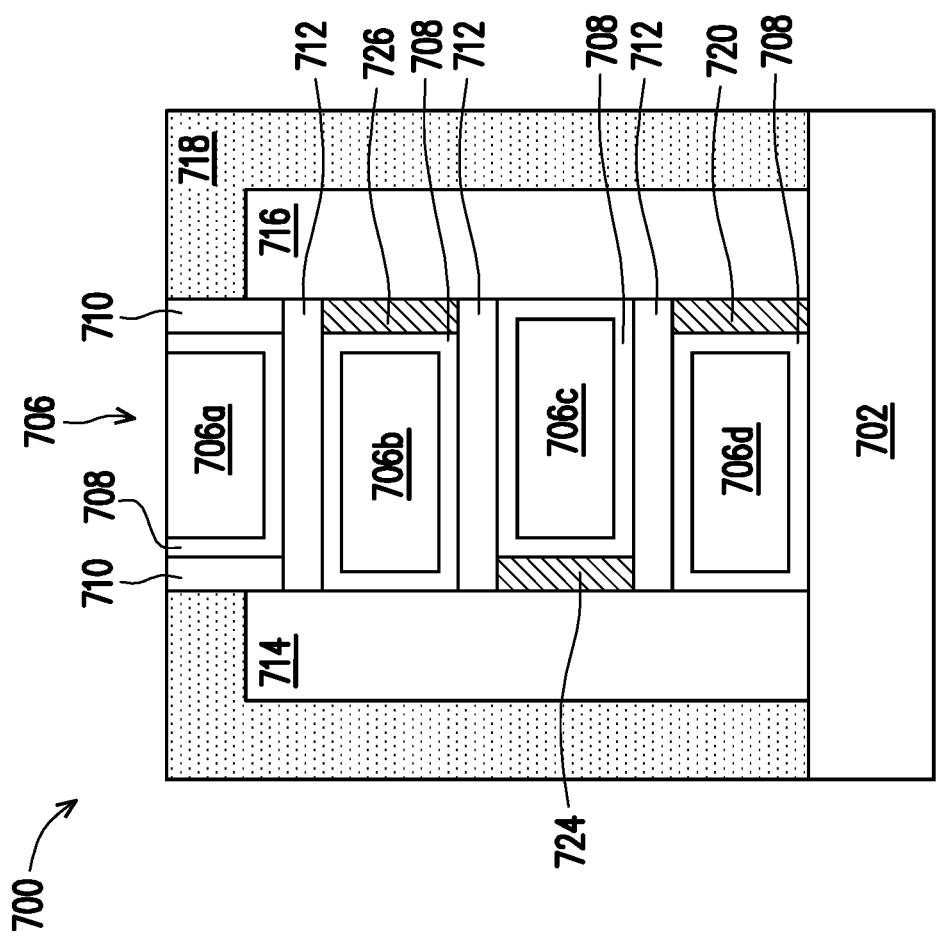

FIGS. 5, 6, and 7 illustrate various example nanostructure transistors including partial inner spacers, in accordance with some embodiments. The term "partial inner spacers" refer to the inner spacers of a nanostructure transistor that do not completely isolate the corresponding gate stacks from respective source or drain features. In contrast, "complete inner spacers" may refer to the inner spacers of a nanostructure transistor that completely isolate the corresponding gate stacks from respective source or drain features. In some embodiments, the nanostructure transistor with partial inner spacers are not limited to being configured as the programming transistor or the reading transistor of an anti-fuse cell. However, to the extent of reducing $V_{BD}/T_{BD}$ of the programming transistor while suppressing the parasitic capacitances of the reading transistor, the programming transistor and reading transistor, for example, may be configured as a nanostructure transistor with partial inner spacers and a nanostructure transistor with complete inner spacers, respectively. In another example, the programming transistor and reading transistor may be configured as a nanostructure transistor with partial inner spacers and a nanostructure transistor also with partial inner spacers, respectively, but a sum of the widths (or heights) of the partial inner spacers in the programming transistor is less than a sum of the widths (or heights) of the partial inner spacers in the reading transistor.

Referring to FIG. 5, a nanostructure transistor 500, including partial inner spacers, is depicted. The nanostructure transistor 500 is formed on a substrate 502. The nanostructure transistor 500 includes a gate metal 506, a gate dielectric 508, gate spacers 510, a number of Si nanostructures collectively functioning as a conduction channel 512, a drain feature 514, and a source feature 516. At least a portion of the nanostructure transistor 500 is embedded in an ILD 518.

The gate metal 506 includes gate metal sections 506a, 506b, 506c, and 506d. The gate metal section 506a and a portion of the gate dielectric 508 may constitute a first one of a number of gate stacks for the nanostructure transistor 500; the gate metal section 506b and a portion of the gate dielectric 508 may constitute a second one of the gate stacks for the nanostructure transistor 500; the gate metal section 506c and a portion of the gate dielectric 508 may constitute a third one of the gate stacks for the nanostructure transistor 500; and the gate metal section 506d and a portion of the gate dielectric 508 may constitute a fourth one of the gate stacks for the nanostructure transistor 500. Each of the gate stacks can at least partially wrap around a corresponding Si nanostructure of the conduction channel 512. In the illustrated embodiment of FIG. 5, the nanostructure transistor 500 include partial inner spacers 520 that only isolate the corresponding gate stacks from the source feature 516, instead of both the drain feature 514 and source feature 516.

Referring to FIG. 6, another nanostructure transistor 600, including partial inner spacers, is depicted. The nanostructure transistor 600 is formed on a substrate 602. The nanostructure transistor 600 includes a gate metal 606, a gate dielectric 608, gate spacers 610, a number of Si nanostructures collectively functioning as a conduction channel 612, a drain feature 614, and a source feature 616. At least a portion of the nanostructure transistor 600 is embedded in an ILD 618.

The gate metal 606 includes gate metal sections 606a, 606b, 606c, and 606d. The gate metal section 606a and a portion of the gate dielectric 608 may constitute a first one of a number of gate stacks for the nanostructure transistor 600; the gate metal section 606b and a portion of the gate dielectric 608 may constitute a second one of the gate stacks for the nanostructure transistor 600; the gate metal section 606c and a portion of the gate dielectric 608 may constitute a third one of the gate stacks for the nanostructure transistor 600; and the gate metal section 606d and a portion of the gate dielectric 608 may constitute a fourth one of the gate stacks for the nanostructure transistor 600. Each of the gate stacks can at least partially wrap around a corresponding Si nanostructure of the conduction channel 612. In the illustrated embodiment of FIG. 6, the nanostructure transistor 600 include partial inner spacers 620 that only isolate the corresponding gate stacks from the drain feature 614, instead of both the drain feature 614 and source feature 616.

Referring to FIG. 7, yet another nanostructure transistor 700, including partial inner spacers, is depicted. The nanostructure transistor 700 is formed on a substrate 702. The nanostructure transistor 700 includes a gate metal 706, a gate dielectric 708, gate spacers 710, a number of Si nanostructures collectively functioning as a conduction channel 712, a drain feature 714, and a source feature 716. At least a portion of the nanostructure transistor 700 is embedded in an ILD 718.

The gate metal 706 includes gate metal sections 706a, 706b, 706c, and 706d. The gate metal section 706a and a portion of the gate dielectric 708 may constitute a first one of a number of gate stacks for the nanostructure transistor 700; the gate metal section 706b and a portion of the gate dielectric 708 may constitute a second one of the gate stacks for the nanostructure transistor 700; the gate metal section 706c and a portion of the gate dielectric 708 may constitute a third one of the gate stacks for the nanostructure transistor 700; and the gate metal section 706d and a portion of the gate dielectric 708 may constitute a fourth one of the gate stacks for the nanostructure transistor 700. Each of the gate stacks can at least partially wrap around a corresponding Si nanostructure of the conduction channel 712. In the illustrated embodiment of FIG. 7, the nanostructure transistor 700 include partial inner spacer 720 that only isolates the corresponding gate stack from the source feature 716 (i.e., leaving the other side of the corresponding gate stack in direct contact with the drain feature 714), inner spacer 724 that only isolates the corresponding gate stack from the drain feature 714 (i.e., leaving the other side of the corresponding gate stack in direct contact with the source feature 716), and inner spacer 726 that only isolates the corresponding gate stack from the source feature 716 (i.e., leaving the other side of the corresponding gate stack in direct contact with the drain feature 714).

In one aspect of the present disclosure, a memory device is disclosed. The memory device includes a plurality of first nanostructures stacked on top of one another; a plurality of first gate stacks where two adjacent ones of the first gate stacks wrap around a corresponding one of the plurality of first nanostructures; a plurality of second nanostructures stacked on top of one another; a plurality of second gate stacks where two adjacent ones of the second gate stacks wrap around a corresponding one of the plurality of second nanostructures; a first drain/source feature electrically coupled to a first end of the first nanostructures; a second drain/source feature electrically coupled to both of a second end of the first nanostructures and a first end of the second nanostructures; and a third drain/source feature electrically coupled to a second end of the second nanostructures. At least one of the plurality of first gate stacks is in direct contact with at least one of the first drain/source feature or the second drain/source feature.

In another aspect of the present disclosure, a memory cell is disclosed. The memory cell includes a first transistor, a second transistor electrically coupled to the first transistor in series. The first transistor includes a plurality of first nanosheets spaced apart from one another along a vertical direction, where the plurality of first nanosheets have a first length along a horizontal direction; and a plurality of first all-around gate stacks operatively associated with the plurality of first nanosheets, where the plurality of first all-around gate stacks have a second length along the horizontal direction, the second length is either equal to or less than the first length. The second transistor includes a plurality of second nanosheets vertically spaced apart from one another, where the plurality of second nanosheets have a third length along the horizontal direction; and a plurality of second all-around gate stacks operatively associated with the plurality of second nanosheets, where the plurality of second all-around gate stacks have a fourth length along the horizontal direction, the fourth length is less than the third length.

In yet another aspect of the present disclosure, a method for fabricating a memory device is disclosed. The method includes forming a first stack over a substrate. The first stack includes a first nanosheet, a second nanosheet over the first nanosheet, and a third nanosheet over the second nanosheet. The method includes forming a second stack over the substrate. The second stack includes a fourth nanosheet, a fifth nanosheet over the fourth nanosheet, and a sixth nanosheet over the fifth nanosheet. The method includes removing respective end portions of the fourth nanosheet and the sixth nanosheet while covering the first stack. The method includes forming a plurality of spacers at the respective etched end portions of the fourth nanosheet and the sixth nanosheet while still covering the first stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
    a plurality of first nanostructures stacked on top of one another;
    a plurality of first gate stacks, two adjacent ones of the first gate stacks wrapping around a corresponding one of the plurality of first nanostructures, each of the first gate stacks essentially consisting of a first gate metal and a first gate dielectric;
    a plurality of second nanostructures stacked on top of one another;
    a plurality of second gate stacks, two adjacent ones of the second gate stacks wrapping around a corresponding one of the plurality of second nanostructures, each of the second gate stacks essentially consisting a second gate metal and a second gate dielectric;
    a first epitaxially grown feature physically coupled to a first end of each of the first nanostructures;
    a second epitaxially grown feature physically coupled to both of a second end of each of the first nanostructures and a first end of each of the second nanostructures; and
    a third epitaxially grown feature physically coupled to a second end of each of the second nanostructures,
    wherein at least one of the plurality of first gate stacks is in direct contact with at least one of the first epitaxially grown feature or the second epitaxially grown feature, the at least one first gate stack having a whole of its sidewall directly contacting the at least one of the first epitaxially grown feature or the second epitaxially grown feature,
    wherein each of the plurality of second gate stacks is electrically isolated from the second epitaxially grown feature by a first dielectric spacer and the first dielectric spacer extends to the first end of each of the second nanostructures.

2. The memory device of claim 1, wherein each of the plurality of second gate stacks is electrically isolated from the third epitaxially grown feature by a second dielectric spacer.

3. The memory device of claim 1, wherein each of the plurality of first gate stacks is in direct contact with both of the first epitaxially grown feature and the second epitaxially grown feature.

4. The memory device of claim 1, wherein the plurality of first gate stacks, the first epitaxially grown feature, and the second epitaxially grown feature are configured as a programming transistor of an anti-fuse memory cell, with the plurality of first nanostructures collectively configured as a conduction channel of the programming transistor, and wherein the plurality of second gate stacks, the second epitaxially grown feature, and the third epitaxially grown feature are configured as a reading transistor of the anti-fuse memory cell, with the plurality of second nanostructures collectively configured as a conduction channel of the reading transistor.

5. The memory device of claim 1, wherein the plurality of first nanostructures each have a first length extending from the first epitaxially grown feature to the second epitaxially grown feature, and the plurality of first gate stacks each have a second length extending from the first epitaxially grown feature to the second epitaxially grown feature.

6. The memory device of claim 5, wherein the first length is equal to the second length.

7. The memory device of claim 1, wherein the plurality of second nanostructures each have a third length extending from the second epitaxially grown feature to the third epitaxially grown feature, and the plurality of second gate stacks each have a fourth length extending from the second epitaxially grown feature to the third epitaxially grown feature.

8. The memory device of claim 7, wherein the fourth length is less than the third length.

9. The memory device of claim 1, wherein the plurality of first nanostructures, the plurality of first gate stacks, the first epitaxially grown feature, and the second epitaxially grown feature collectively function as a first transistor of a one-time-programmable (OTP) memory cell, and the plurality of second nanostructures, the plurality of second gate stacks, the second epitaxially grown feature, and the third epitaxially grown feature collectively function as a second transistor of the OTP memory cell.

10. The memory device of claim 9, wherein the first transistor and second transistor are connected in series through the second epitaxially grown feature.

11. The memory device of claim 9, wherein the first transistor and second transistor have a same conductive type.

12. The memory device of claim 1, wherein the plurality of first nanostructures and the plurality of second nanostructures extend along a same horizontal direction.

13. A memory cell, comprising:
    a first transistor; and
    a second transistor electrically coupled to the first transistor in series by sharing a first epitaxially grown feature,
    wherein the first transistor comprises:
        a plurality of first nanosheets spaced apart from one another along a vertical direction, the plurality of first nanosheets having a first length along a horizontal direction; and
        a plurality of first all-around gate stacks operatively associated with the plurality of first nanosheets, the plurality of first all-around gate stacks having a second length along the horizontal direction, the second length is equal to the first length, each of the first all-around gate stacks essentially consisting of a first gate metal and a first gate dielectric, each of the plurality of first all-around gate stacks having a whole of its sidewall directly contacting the first epitaxially grown feature, and wherein the second transistor comprises:
  a plurality of second nanosheets vertically spaced apart from one another, the plurality of second nanosheets having a third length along the horizontal direction; and
  a plurality of second all-around gate stacks operatively associated with the plurality of second nanosheets, the plurality of second all-around gate stacks having a fourth length along the horizontal direction, the fourth length is less than the third length, each of the first all-around gate stacks essentially consisting of a second gate metal and a second gate dielectric;
  wherein each of the plurality of second all-around gate stacks is separated from the first epitaxially grown feature with a plurality of inner spacers, each of the plurality of inner spacers having a fifth length along the horizontal direction substantially equal to a difference between the fourth length and third length.

14. The memory cell of claim 13, further comprising:
a second epitaxially grown feature disposed on a first side of the plurality of first all-around gate stacks, with the first epitaxially grown feature disposed on a second side of the plurality of first all-around gate stacks;
wherein each of the plurality of first all-around gate stacks is in direct contact with both of the first epitaxially grown feature and the second epitaxially grown feature such that the second length is substantially equal to the first length.

15. The memory cell of claim 13, further comprising:
a third second epitaxially grown feature disposed on a first side of the plurality of second all-around gate stacks, with the first epitaxially grown feature disposed on a second side of the plurality of second all-around gate stacks.

16. The memory cell of claim 13, wherein the first transistor and second transistor function as a programming transistor and a reading transistor of a one-time-programmable (OTP) memory cell, respectively, and wherein the first transistor and second transistor have a same conductive type.

17. The memory cell of claim 13, wherein the plurality of inner spacers are partial inner spacers electrically isolating only one end of the plurality of second all-around gate stacks.

18. A memory device, comprising:
  a plurality of first nanosheets having a first length along a horizontal direction;
  a plurality of first all-around gate stacks operatively associated with the plurality of first nanosheets, the plurality of first all-around gate stacks having a second length along the horizontal direction;
  a plurality of second nanosheets having a third length along the horizontal direction; and
  a plurality of second all-around gate stacks operatively associated with the plurality of second nanosheets, the plurality of second all-around gate stacks having a fourth length along the horizontal direction;
  wherein a first drain/source epitaxially grown feature and a second drain/source epitaxially grown feature are in direct contact with both ends of the plurality of first all-around gate stacks, respectively, such that the second length is equal to the first length, each of the plurality of first all-around gate stacks having a whole of its sidewall directly contacting the first drain/source epitaxially grown feature or the second drain/source epitaxially grown feature; and
  wherein the second drain/source epitaxially grown feature and a third drain/source epitaxially grown feature are separated from both ends of the plurality of second all-around gate stacks, respectively, with a plurality of inner spacers, such that the fourth length is less than the third length, wherein the plurality of inner spacers have a fifth length along the horizontal direction substantially equal to a difference in the fourth length and third length.

19. The memory device of claim 18, wherein the plurality of first nanosheets, the plurality of first all-around gate stacks, the first epitaxially grown feature, and the second epitaxially grown feature collectively function as a first transistor of a one-time-programmable (OTP) memory cell, and the plurality of second nanosheets, the plurality of second all-around gate stacks, the second epitaxially grown feature, and the third epitaxially grown feature collectively function as a second transistor of the OTP memory cell.

20. The memory device of claim 18, wherein the plurality of inner spacers are partial inner spacers electrically isolating only one end of the plurality of second all-around gate stacks.

* * * * *